(12) United States Patent
Kutsukake et al.

(10) Patent No.: US 8,294,238 B2
(45) Date of Patent: Oct. 23, 2012

(54) NONVOLATILE SEMICONDUCTOR MEMORY DEVICE WITH REDUCED SIZE OF PERIPHERAL CIRCUIT AREA

(75) Inventors: Hiroyuki Kutsukake, Yokohama (JP); Takayuki Toba, Yokohama (JP); Yoshiko Kato, Yokohama (JP); Kenji Gomikawa, Yokohama (JP); Haruhiko Koyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 12/765,477

(22) Filed: Apr. 22, 2010

(65) Prior Publication Data

US 2010/0270606 A1    Oct. 28, 2010

(30) Foreign Application Priority Data

Apr. 24, 2009  (JP) ................. 2009-106670

(51) Int. Cl.
*H01L 21/70* (2006.01)

(52) U.S. Cl. ........ 257/506; 257/296; 257/330; 257/331; 257/332; 257/333; 257/334; 257/346; 257/365; 257/368; 257/374; 257/387; 257/395; 257/401; 257/524; 257/E27.06; 257/E21.548; 257/E21.635; 257/E21.638; 257/E29.027; 257/E29.02; 257/E29.04; 257/E29.051; 257/E29.062; 257/E29.122; 257/E29.127; 257/E29.128; 257/E29.214; 257/E21.209; 438/435; 438/436; 438/437; 438/438; 438/439

(58) Field of Classification Search ........... 257/E21.635, 257/E21.638, 296, 330, 331, 332, 334, 346, 257/365, 368, 387, 401, E27.06, E29.027, 257/E29.04, E29.051, E29.062, E29.122, 257/E29.127, E29.128, E29.214, E21.209, 257/395, 333, E21.548, E29.02, 374, 524, 257/506; 438/435, 436, 437, 438, 439

See application file for complete search history.

(56) References Cited

U.S. PATENT DOCUMENTS

| 7,119,413 B2 | 10/2006 | Kutsukake et al. | |
|---|---|---|---|
| 2006/0001108 A1* | 1/2006 | Yamamoto | 257/395 |
| 2007/0259507 A1* | 11/2007 | Matsuda | 438/424 |
| 2007/0290232 A1 | 12/2007 | Nishiyama | |
| 2008/0037311 A1* | 2/2008 | Tanaka | 365/72 |
| 2008/0298125 A1* | 12/2008 | Taniwaki et al. | 365/185.05 |
| 2009/0161427 A1 | 6/2009 | Nakamura et al. | |

FOREIGN PATENT DOCUMENTS

| JP | 11-17165 | 1/1999 |
|---|---|---|
| JP | 2007-335763 | 12/2007 |

OTHER PUBLICATIONS

U.S. Appl. No. 13/415,010, filed Mar. 8, 2012, Kato.

* cited by examiner

*Primary Examiner* — Matthew E Warren
*Assistant Examiner* — David Chen
(74) *Attorney, Agent, or Firm* — Oblon, Spivak, McClelland, Maier & Neustadt, L.L.P.

(57) ABSTRACT

A peripheral circuit area is formed around a memory cell array area. The peripheral circuit area has element regions, an element isolation region isolating the element regions, and field-effect transistor formed in each of the element regions and including a gate electrode extending in a channel width direction, on a semiconductor substrate. An end portion and a corner portion of the gate electrode are on the element isolation region. A radius of curvature of the corner portion of the gate electrode is smaller than a length from the end portion of the element region in the channel width direction to the end portion of the gate electrode in the channel width direction, and is less than 85 nm.

5 Claims, 23 Drawing Sheets

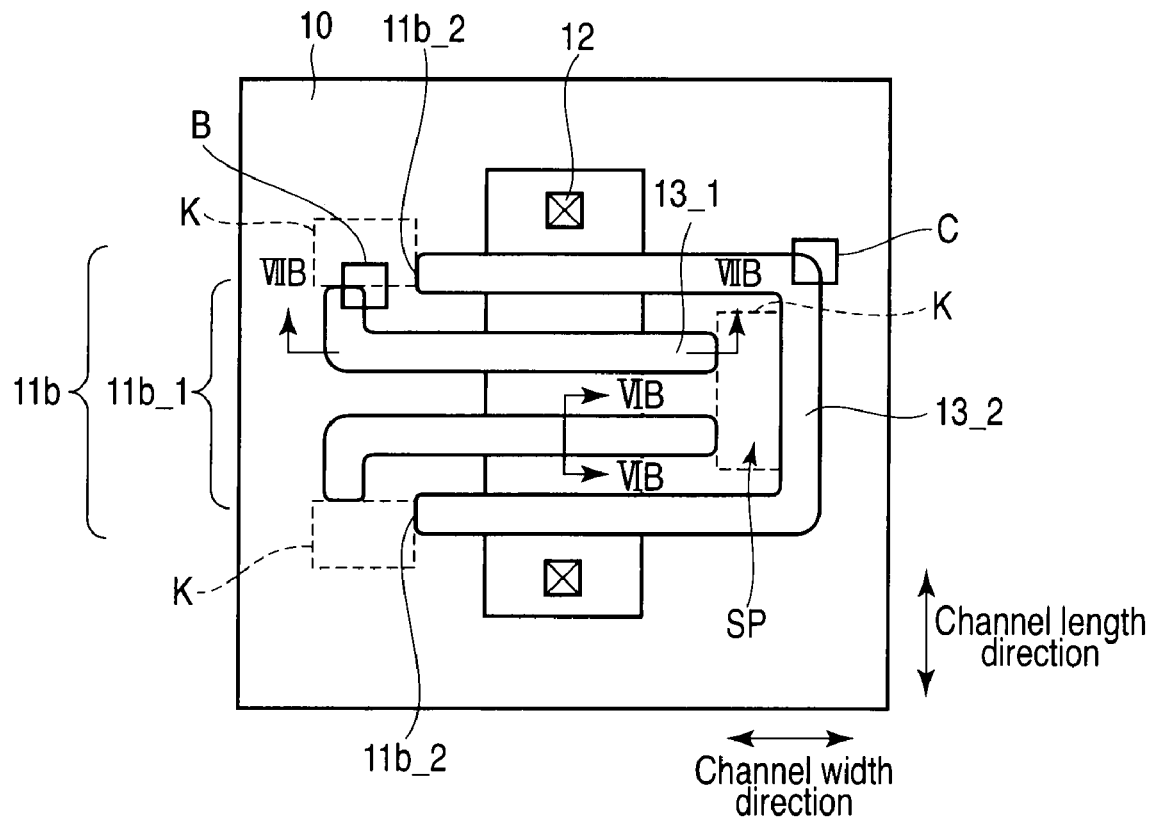
F I G. 3A
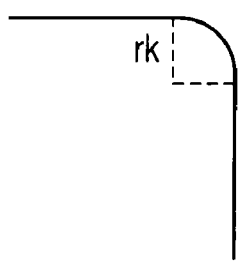
F I G. 3B
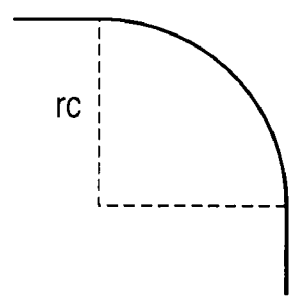
F I G. 3C

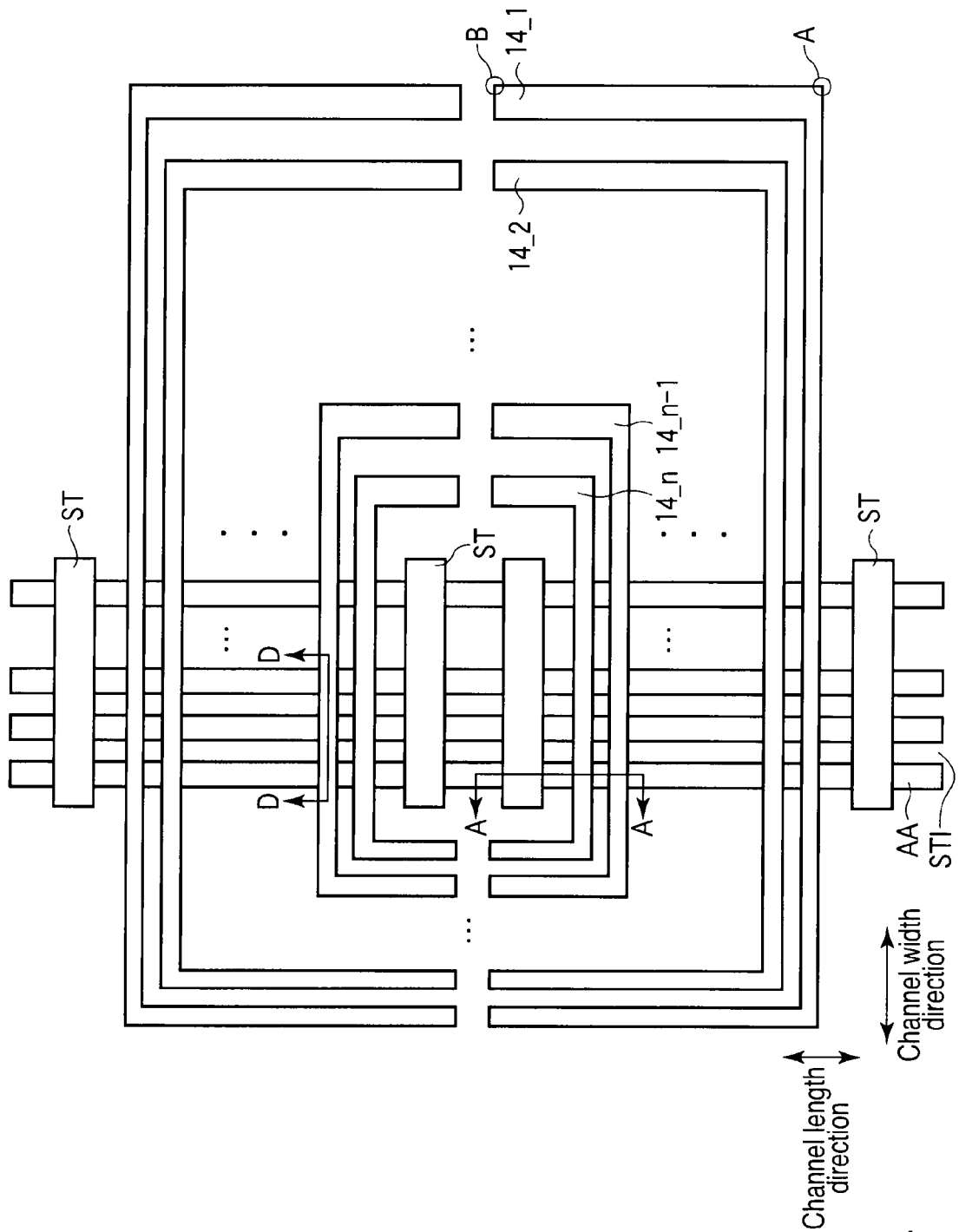
F I G. 4

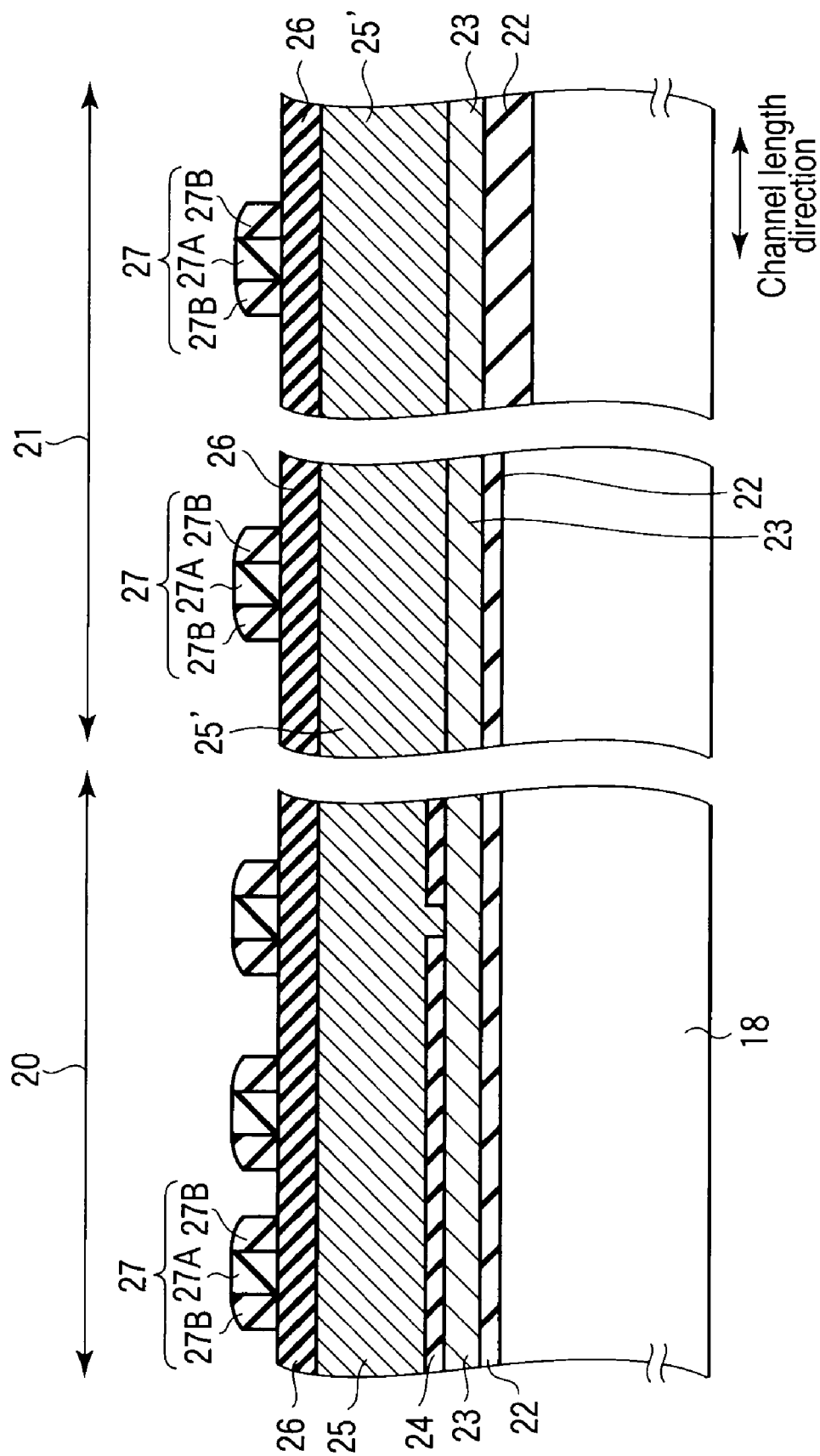

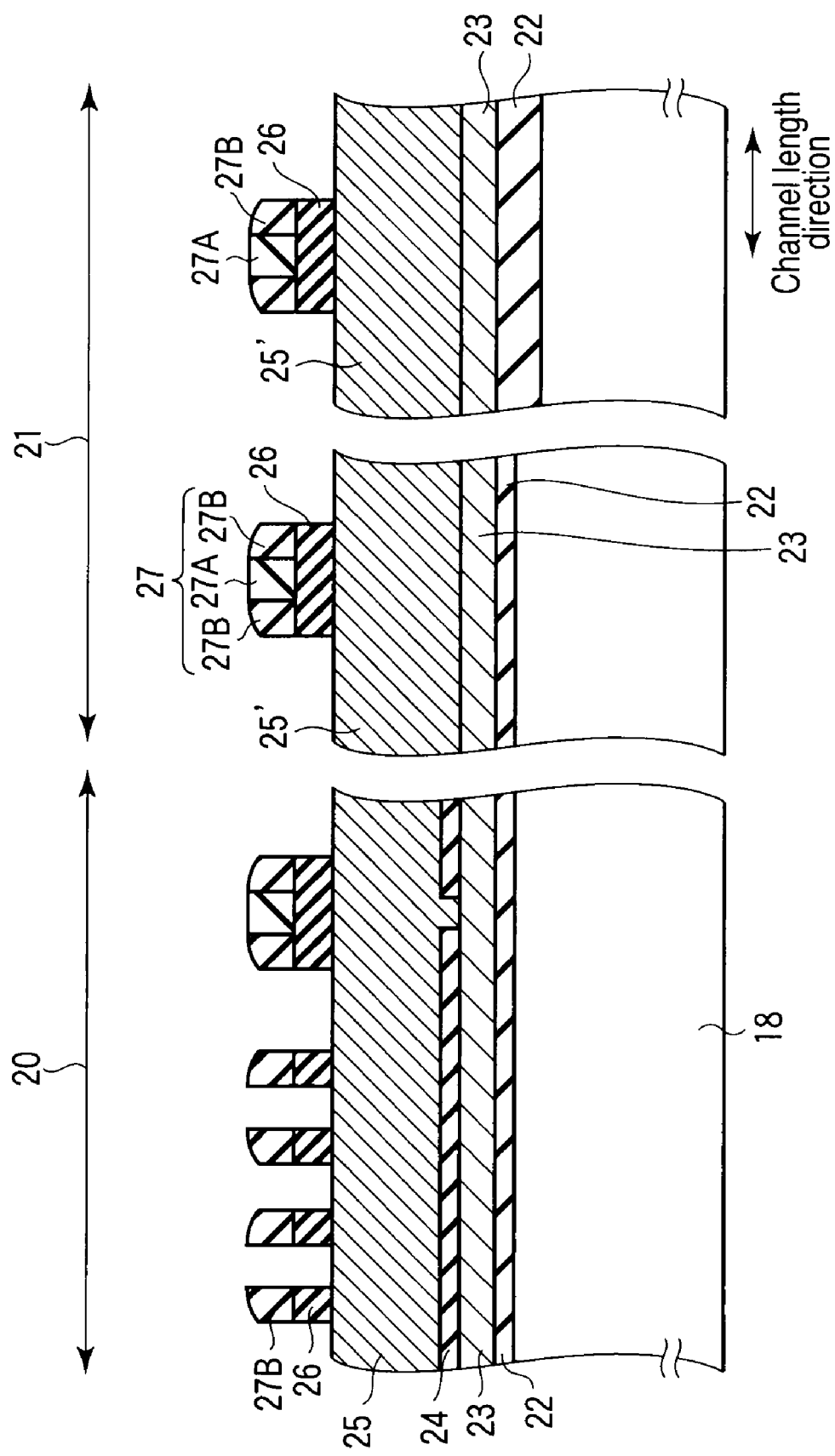

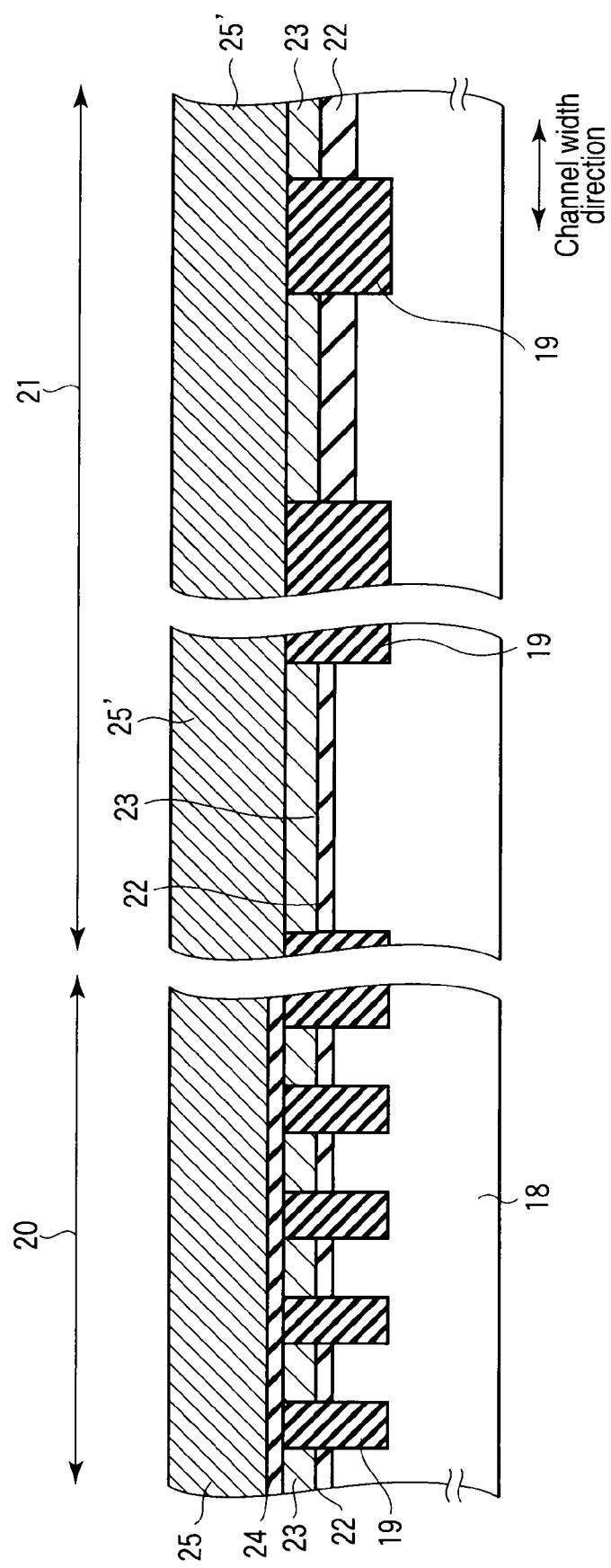

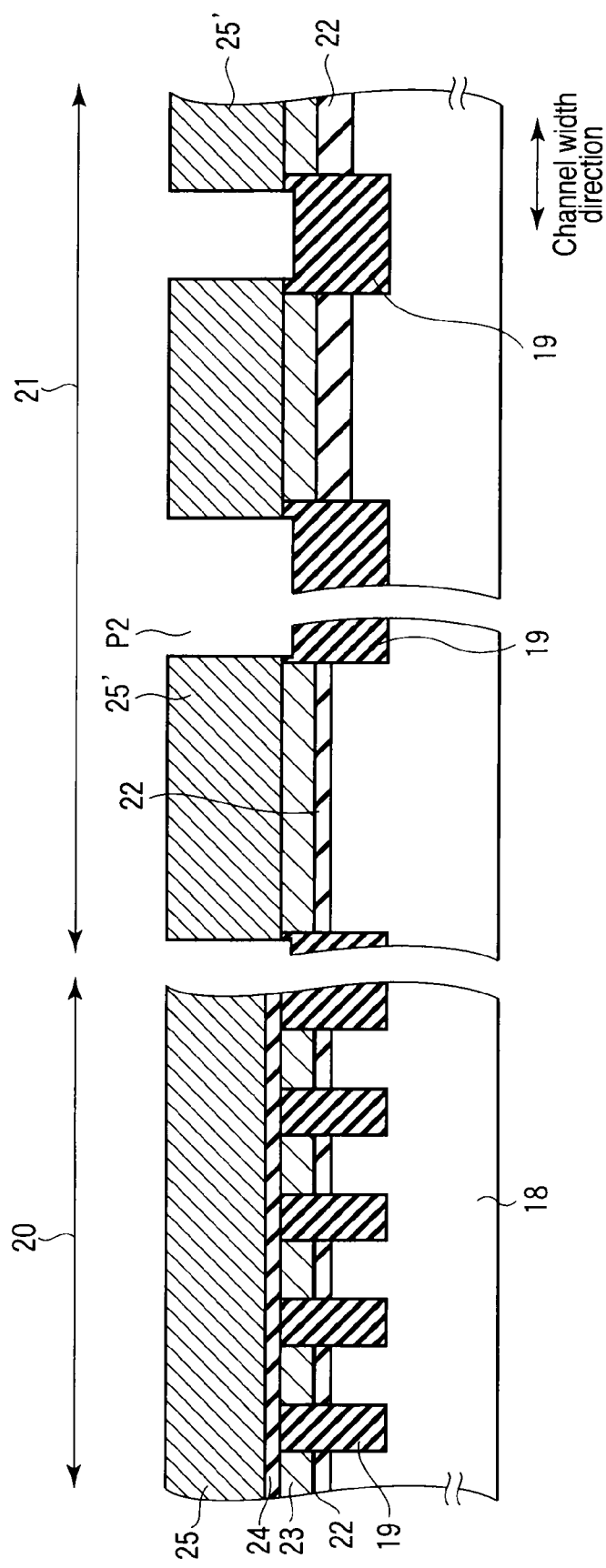

NONVOLATILE SEMICONDUCTOR MEMORY DEVICE WITH REDUCED SIZE OF PERIPHERAL CIRCUIT AREA

CROSS-REFERENCE TO RELATED APPLICATIONS

This application is based upon and claims the benefit of priority from prior Japanese Patent Application No. 2009-106670, filed Apr. 24, 2009, the entire contents of which are incorporated herein by reference.

BACKGROUND OF THE INVENTION

1. Field of the Invention

The present invention relates to a nonvolatile semiconductor memory device, and to a method of manufacturing the device.

2. Description of the Related Art

A nonvolatile semiconductor memory device, for example, a NAND flash memory is loaded in various electronic apparatuses. In the NAND flash memory, the shrinking of a memory cell transistor is advanced to increase a storage capacity.

For example, the microscopic processing technique (sidewall processing technique) (e.g., see Jpn. Pat. appln. KOKAI Publication No. 2007-335763) has been proposed in order to perform the shrinking of the memory cell transistor. According to the technique, an underlying layer is processed using a sidewall as a mask.

With the shrinking of the memory cell transistor, the area of a peripheral circuit area is reduced. However, it is difficult to perform the shrinking of a field-effect transistor formed on the peripheral circuit area.

BRIEF SUMMARY OF THE INVENTION

According to a first aspect of the invention, there is provided a nonvolatile semiconductor memory device comprising: a memory cell array area; and a peripheral circuit area formed around the memory cell array area, wherein the peripheral circuit area has element regions, an element isolation region isolating the element regions, and a field-effect transistor formed in each of the element regions and including a gate electrode extending in a channel width direction, on a semiconductor substrate, and an end portion and a corner portion of the gate electrode in the channel width direction are disposed on the element isolation region, and further, a radius of curvature of the corner portion of the gate electrode is smaller than a length from the end portion of the element region in the channel width direction to the end portion of the gate electrode in the channel width direction, and is less than 85 nm.

According to a second aspect of the invention, there is provided a nonvolatile semiconductor memory device comprising: a memory cell array area; and a peripheral circuit area formed around the memory cell array area, wherein the peripheral circuit area has element regions, an element isolation region isolating the element regions, and field-effect transistors formed in the element regions respectively, each of the field-effect transistors including a gate electrode extending in a channel width direction, on a semiconductor substrate and an end portion and a corner portion of the gate electrode in the channel width direction projects from the element region, and are disposed on the element isolation region, and further, the element isolation region has a recess between the gate electrodes of the field-effect transistors which are adjacent to each other in the channel width direction.

According to a third aspect of the invention, there is provided a method of forming a nonvolatile semiconductor memory device comprising: forming a gate electrode material extending in the channel width direction, which ranges over element regions, in a peripheral circuit area, while forming a loop-shaped word line in a memory cell array area, in a semiconductor substrate; and forming a gate electrode in each of portions to correspond to the element regions in the peripheral circuit area by dividing the gate electrode material, while the loop-shaped word line dividing line-like structure in the memory cell array area.

BRIEF DESCRIPTION OF THE SEVERAL VIEWS OF THE DRAWING

FIGS. 3A, 3B and 3C are plan views schematically showing a field-effect transistor;

FIG. 4 is a plan view showing a memory cell array area;

FIGS. 11A, 11B and 11C are sectional views taken along the channel length direction, showing the formation process of the present invention;

FIGS. 12A, 12B and 12C are sectional views taken along the channel length direction, showing the formation process of the present invention;

FIGS. 14A, 14B and 14C are sectional views taken along the channel width direction, showing the formation process of the present invention;

FIGS. 20A, 20B and 20C are sectional views taken along the channel width direction, showing the formation process of the present invention;

DETAILED DESCRIPTION OF THE INVENTION

Figure 1A:
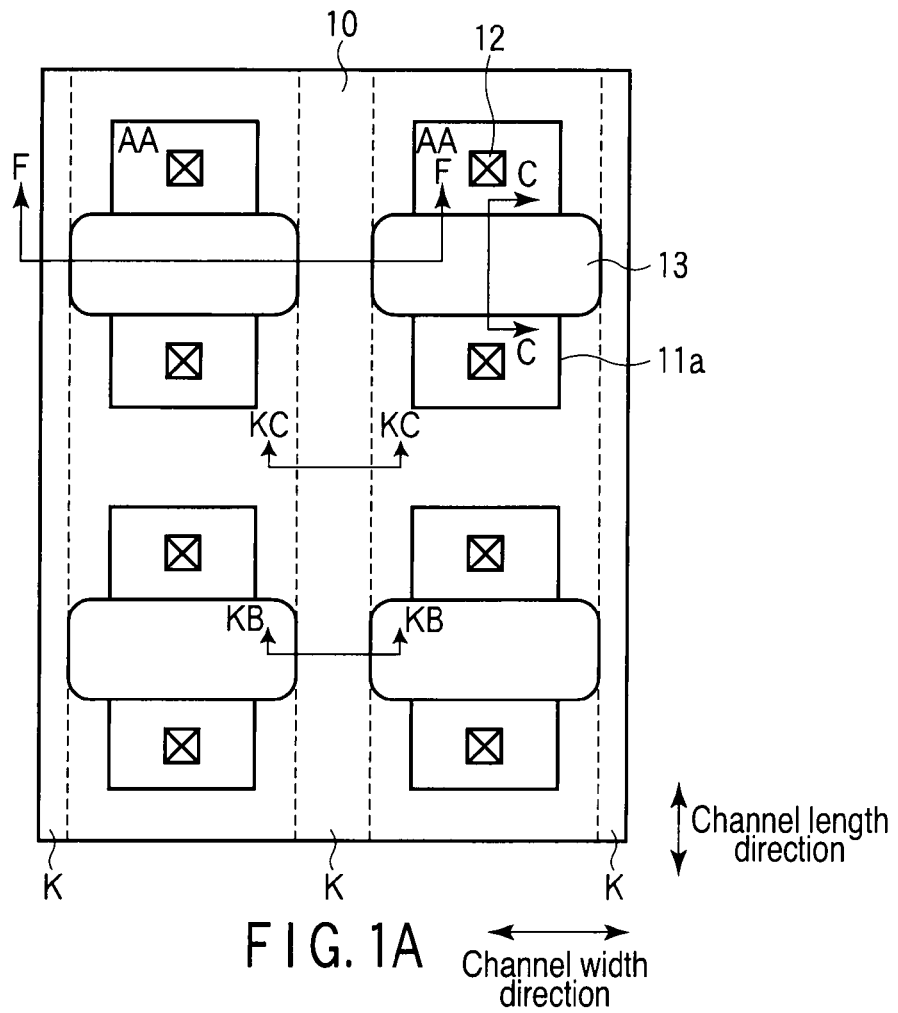
FIGS. 1A, 1B and 1C are plan views schematically showing a field-effect transistor.

The best embodiment for carrying out an example of the present invention will be hereinafter described in detail with reference to the drawings. In the following drawings, the same reference numerals are used to designate the identical portions.

1. Outline

It is needed that in order to shrink of a peripheral circuit area, in a field-effect transistor formed on a peripheral circuit area the width from an end portion of an element region in the channel width direction to an end portion of a gate electrode in the channel width direction is narrowed.

However, it has been known that a corner portion of a gate electrode of a field-effect transistor is rounded by the influence by photolithography and reactive ion etching (RIE). If the rounded portion of the corner of the gate electrode disposed on an element region, characteristics of the field-effect transistor are changed.

For this reason, in the field-effect transistor formed in a peripheral circuit area, the width from an end portion of an element region in the channel width direction to an end portion of a gate electrode in the channel width direction is set in the following manner. Namely, the width is set with a margin such that the rounded portion of the corner of the gate electrode is not disposed on the element region.

Moreover, the margin is set considering a lithography alignment variation; for this reason, it is difficult to reduce the area of the peripheral circuit area.

However, according to an embodiment of the present invention, in the field-effect transistor formed in a peripheral circuit area, the corner portion of a gate electrode has a radius of curvature of 85 nm or less. Therefore, even if a gate fringe length is reduced, the rounded portion of the corner of the gate electrode is not disposed on an element region. As a result, a space between the field-effect transistors is reduced, and thereby, this serves to reduce the area of a peripheral circuit area.

According to the present invention, the structure is realized using two-time etchings.

Specifically, according to the first-time etching, the following gate electrode is formed. Namely, the gate electrode extends in the channel width direction ranging over a plurality of element regions in a peripheral circuit area.

According to the second-time etching, the gate electrode is divided to portions to correspond to each of the plurality of the element regions.

Moreover, if word lines of a memory cell array area are processed using so-called sidewall etching, an end portion of the word lines of the memory cell array area is removed to divide each of word lines. In other words, the end portion of the word line of the memory cell array area is processed using two-time etchings. So, the gate electrode is processed while the word line of the memory cell array area is processed, and thereby, the number of processes is not increased.

2. Embodiment

(1) Device Structure

FIG. 1A is a plan view schematically showing a high-breakdown-voltage field-effect transistors in a peripheral circuit area.

As shown in FIG. 1A, an element isolation region 10 and element regions AA surrounded with the element isolation region 10 are formed on a semiconductor substrate (not shown). These element regions AA are isolated by the element isolation region 10, and arrayed like a matrix. A high-breakdown-voltage field-effect transistor 11a is formed in each of the element regions AA. Each of transistors 11a includes a gate electrode 13 and a source/drain region S/D.

The gate electrode 13 is disposed on the center portion of the element region AA in the channel length direction, and extends in the channel width direction. The end portion and corner portion of the gate electrode 13 in the channel width direction are disposed in the element isolation region 10 projecting from the element region AA. Further, the gate electrode 13 is separated from every transistor 11a. In other words, the gate electrode 13 extending in the channel width direction is separated in the element region 10 between transistors 11a. Therefore, each transistor 11a has one gate electrode 13 extending in the channel width direction. A recess K extending in the channel length direction is formed in the element region 10 through the region between the gate electrodes 13 in the channel width direction.

The source/drain regions S/D are formed in the element region AA as sandwiching the gate electrode 13. Each of the source/drain regions S/D is formed with a contact 12 for making contact with an interconnect layer.

Figure 1B:
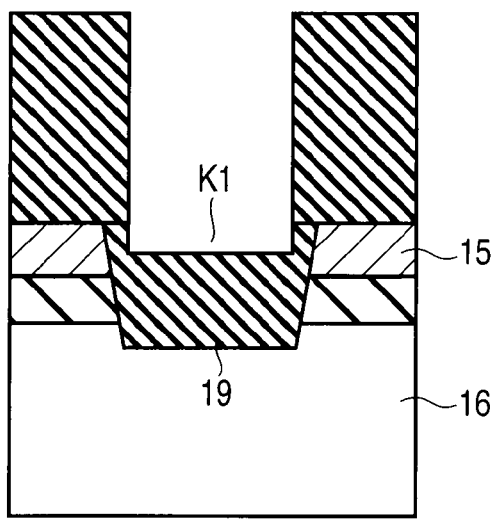
Figure 1C:
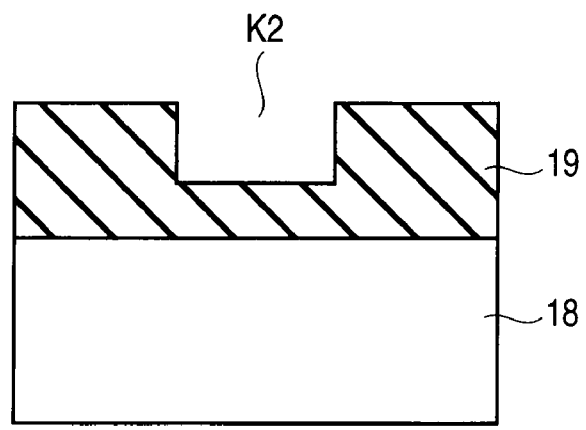

FIG. 1B is sectional views along line KB-KB in FIG. 1A, and FIG. 1C is sectional views along line KC-KC in FIG. 1A. As shown in FIG. 1B and FIG. 1C, the recess K2 not located between the gate electrodes 13 is deeper than the recess K1 located between the gate electrodes 13. In other words, the recess K1 is formed contacting to the gate electrodes, the recess K2 is formed except for contacting to the gate electrodes. The recess K1 and K2 are distance from a top surface of the isolation insulating film 19 to a bottom surface of the isolation insulating film 19.

Figure 2:
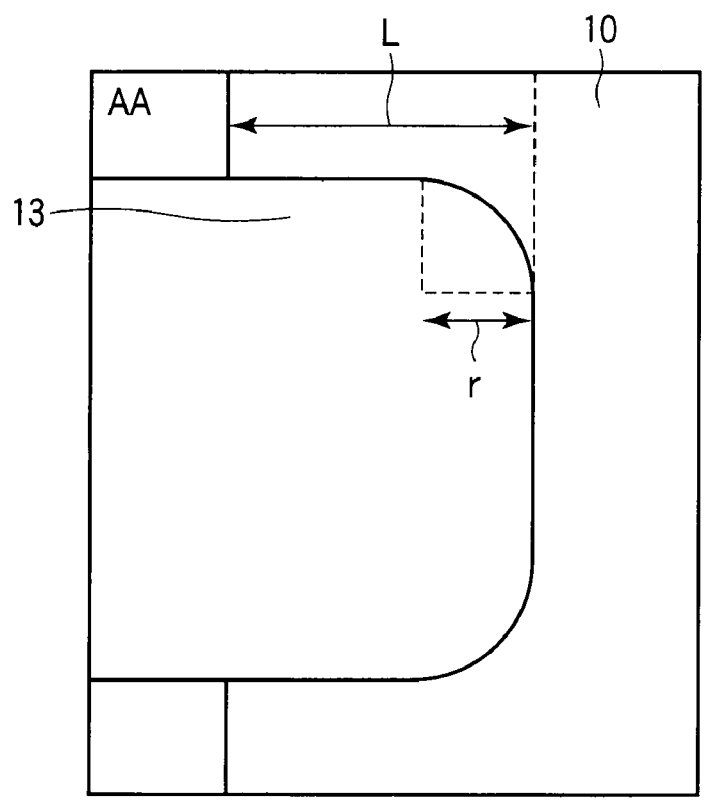
FIG. 2 is an enlarged view showing the end and corner portions of a gate electrode of a field-effect transistor.

FIG. 2 is an enlarged view showing the end portion and corner portion of the gate electrode 13 of the high-breakdown-voltage field-effect transistor shown in FIG. 1A in the channel width direction.

As shown in FIG. 2, the width from the end portion of the element region AA to the end portion of the gate electrode 13 in the channel width direction is defined as a gate fringe length L. The roundness of the corner portion of the gate electrode 13 is defined as a radius of curvature r.

In this case, the gate fringe length L is set to a sufficient length such that the roundness of the corner portion of the gate electrode 13 is not disposed on an element region AA. Specifically, the gate fringe length L is at least set more than the radius of curvature showing the roundness of the corner portion of the gate electrode 13. Further, the gate fringe length L is set considering a lithography alignment variation and size reduction in processing. Namely, the relationship between the gate fringe length L and the radius of curvature r is expressed by the following equation:

$$L = r + \alpha$$

where, α is a value determined considering a lithography alignment variation and size variation in processing.

For example, the radius of curvature r of the corner portion of the gate electrode 13 is 85 nm or less.

In case the radius of curvature r is short, the gate fringe length L is short. Thus, the area of peripheral circuit area can be shrunk.

FIG. 3A is a plan view schematically showing a low-breakdown-voltage field-effect transistors in a peripheral circuit area.

As illustrated in FIG. 3A, four low-breakdown-voltage field-effect transistors 11b are formed on the element region AA isolated by the element isolation region 10. Two low-breakdown-voltage field-effect transistors 11b_2 are disposed outside two low-breakdown-voltage field-effect transistors 11b_1 to surround transistors 11b_1. Transistors 11b_2 have a gate electrode 13_2 in common. Conversely, transistors 11b_1 each have an independent gate electrode 13_1. The outside (side converse to transistor 11b_1) of transistor 11b_2 is formed with a contact 12. In this way, transistor 11b forms an NAND circuit.

A space SP is formed between the commonly used portion of gate electrode 13_2 of transistors 11b_2 and the end portion of gate electrode 13_1. In other words, a space SP is formed in an element isolation region surrounded by gate electrode 13_2 and the isolation region AA. A recess K is formed in the element isolation region in the space SP, and near the end portion of gate electrode 13_1 and gate electrode 13_2.

The film thickness of a gate insulating material of the low-breakdown-voltage field-effect transistor 11b is different from the high-breakdown-voltage field-effect transistors 11a. Specifically, the film thickness of the gate insulating material of transistor 11b is less than that of transistors 11a.

FIG. 3B is an enlarged view showing a region B in FIG. 3A, FIG. 3C is an enlarged view showing a region C in FIG. 3A. As shown in FIG. 3B, the roundness of the corner portion of the gate electrode 13_1 adjacent to recess K is defined as a radius of curvature rk. As shown in FIG. 3C, the roundness of the corner portion of the gate electrode 13_2 not adjacent to recess K is defined as a radius of curvature rc. The radius of curvature rc is larger than the radius of curvature rk.

FIG. 4 is a plan view showing a memory cell array area. As shown in FIG. 4, an element region AA has a stripe shape extending in the channel length direction. The element regions AA are arranged with line and space in the channel width direction crossing the channel length direction. An element isolation region STI is formed between neighboring element regions AA. The element regions AA are electrically isolated by the element isolation region STI. Stripe-shaped word lines 14 and select gate lines ST extending in the channel width direction are formed to cross (run perpendicular to) the element regions AA. A crossed area of the word line 14 and the element region AA is provided with a memory cell transistor. A crossed area of the select gate line ST and the isolation region AA is provided with a select gate transistor. Each element region AA between neighboring word lines 14, between select gate lines ST and between word line 14 and select gate line ST is an impurity diffusion layer (not shown). The impurity diffusion layer functions as a source region or a drain region of the memory cell transistor and select transistor.

The word line 14 has loop shapes comprising the following word lines. One is the outermost word line 14_1, and another is word lines 14_2 . . . 14n−1 arranged inside the word line 14_1, and another is a word line 14_n arranged inside the word line 14_n. These word lines 14 are separated in the channel width direction from the select gate lines ST. Specifically, each word line 14 is bent toward the channel length direction from the end portion of the word line in the channel width direction. Further, the bent end portion of the word line in the channel width direction is separated from the select gate lines ST in the channel width direction. In other words, these word lines 14 each have a loop shape, and are separated at the center in the channel length direction.

Figure 5:
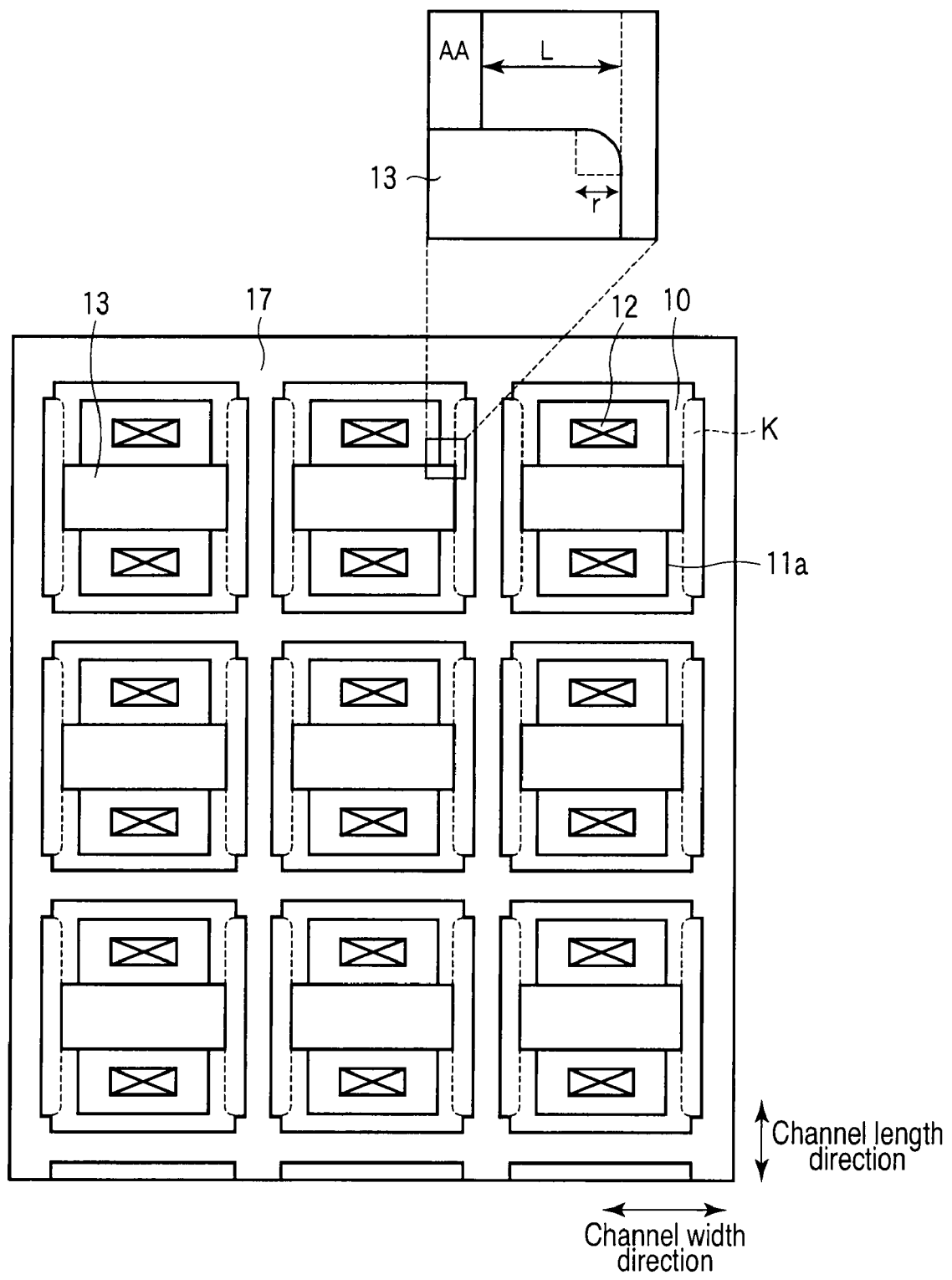
FIG. 5 is a plan view showing a modification example of a field-effect transistor.

FIG. 5 is a plan view showing a modification example of the high-breakdown-voltage field-effect transistor shown in FIG. 1.

As shown in FIG. 5, this example differs from FIG. 1 in that an isolation region 10 is provided with a shield conductive layer 17, which surrounds transistor 11a. The shield conductive layer 17 is formed between the transistors 11a in a state of electrically isolated from a gate electrode 13.

The shield conductive layer 17 is grounded, and zero voltage or a predetermined negative bias is applied to the layer 17. The structure is effectively applicable to a transfer transistor, which transfers a high voltage to a word line. Because, the width between isolation regions of a transfer transistor is relatively wide in order to improve the breakdown voltage between transfer transistors. For example, the width between isolation regions of a transfer transistor is 1 μm. Therefore, the shield conductive layer 17 is easily arranged. In addition, the shield conductive layer 17 serves to prevent a field reverse leakage current generated between transfer transistors.

A recess K extending in the channel length direction is formed in the element isolation region adjacent to the shield conductive layer 17. A width of the recess K in the channel width direction is equal to a distance between the shield conductive layer 17 and the gate electrode 13.

An end portion of the gate electrode 13 of the transfer transistors is same structure as FIG. 2.

(2) Formation Method

A formation method according to the present invention will be described below.

Figure 6:
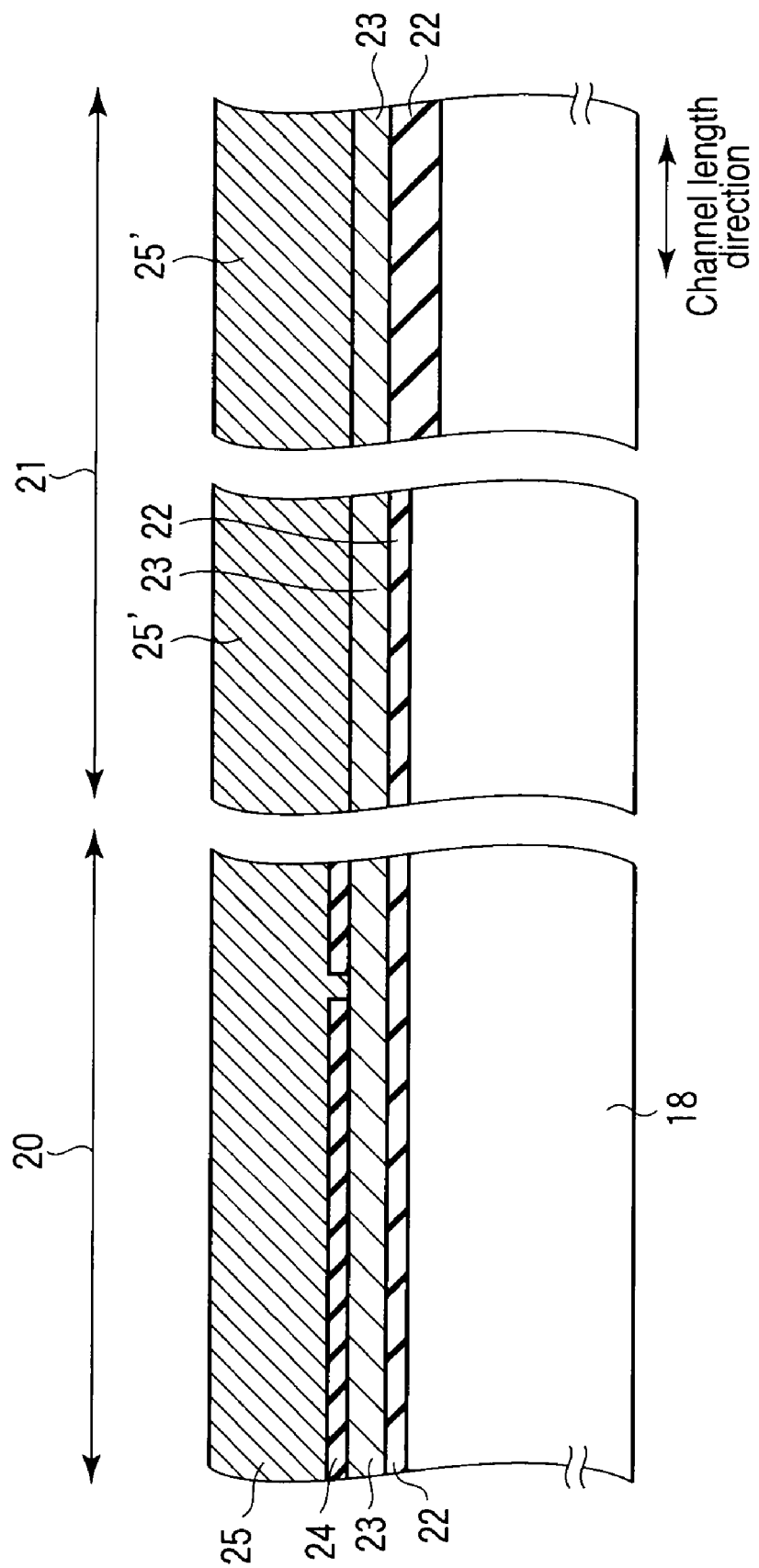
FIGS. 6A, 6B and 6C are sectional views taken along the channel length direction, showing the formation process of the present invention.
Figure 7:
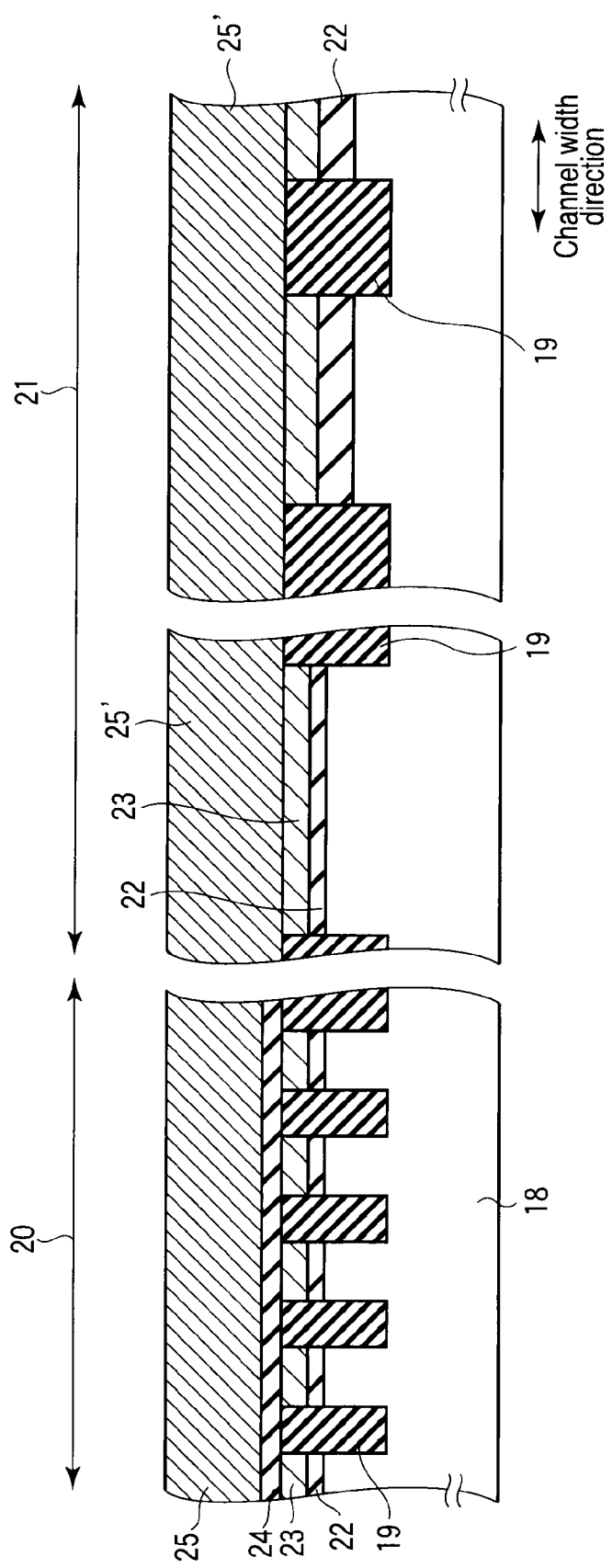
FIGS. 7A, 7B and 7C are sectional views taken along the channel width direction, showing the formation process of the present invention.

FIG. 6A is a sectional view taken along line A-A in FIG. 4. FIG. 6B is a sectional view taken along line VIB-VIB in FIG. 3A. FIG. 6C is a sectional view taken along line C-C in FIG. 1. FIG. 7A is a sectional view taken along line D-D in FIG. 4. FIG. 7B is a sectional view taken along line VIIB-VIIB in FIG. 3A. FIG. 7C is a sectional view taken along line F-F in FIG. 1.

A method of forming a nonvolatile semiconductor memory device will be described below. In the following drawings, a sectional view along the channel length direction shows the same region as FIGS. 6A to 6C and a sectional view along the channel width direction shows the same region as FIGS. 7A to 7C.

As shown in FIGS. 6A to 6C and 7A to 7C, a gate insulating film material 22 is formed on a semiconductor substrate 18 in a memory cell array area 20 and a peripheral circuit area 21. In this case, the gate insulating film material 22 of a high-breakdown-voltage field-effect transistor formation region is deposited thick than that of a low-breakdown-voltage field-effect transistor formation region and the memory cell array area. For example, the gate insulating film material 22 is oxide silicon or has a stacked structure containing the oxide silicon.

A floating gate electrode material 23 is formed on the gate insulating film material 22 using a CVD process, for example. Thereafter, as illustrated in FIG. 7A, an isolation insulating film 19 having a shallow trench isolation (STI) structure is formed in the semiconductor substrate 18 in the memory cell array area 20. An element region isolated by the isolation insulating film 19 is formed in this process. As shown in FIGS. 6A and 7A, in the memory cell array area 20, an intergate insulating film material 24 and a word line material (conductive material) 25 are successively formed on the floating gate electrode material 23 and isolation insulating film material 19 using a CVD process.

In the peripheral circuit area 21, as seen from FIGS. 6B, 6C, 7B and 7C, an isolation insulating film 19 having a STI structure is formed in the semiconductor substrate 18 was well as the memory cell array area 20. Thereafter, an intergate insulating film material 24 and a gate electrode material (conductive material) 25' are successively formed on the floating gate electrode material 23 and isolation insulating film 19 using a CVD process, for example.

In select gate transistor, low-breakdown-voltage field-effect transistor and high-breakdown-voltage field-effect transistor formation regions, the intergate insulating film material 24 is formed on the floating gate electrode material. Thereafter, a part of the intergate insulating film material 24 is removed so that an opening is formed. Thereafter, a word line 25 is deposited so that the floating gate electrode material 23 and the word line material 25 are electrically connected by means of the formed opening.

For example, conductive polysilicon is used as the floating gate electrode material 23. For example, the intergate insulating film material 24 is oxide silicon, nitride silicon and has a stacked structure containing silicon described above or has a single-layer structure of a high-dielectric material such as $Al_2O_3$ and HFSiON or has a stacked structure containing those materials. A conductive material, for example, conductive polysilicon is used as the word line material 25. In this case, the word line material 25 has a stacked structure of conductive polysilicon and silicide.

Figure 8:
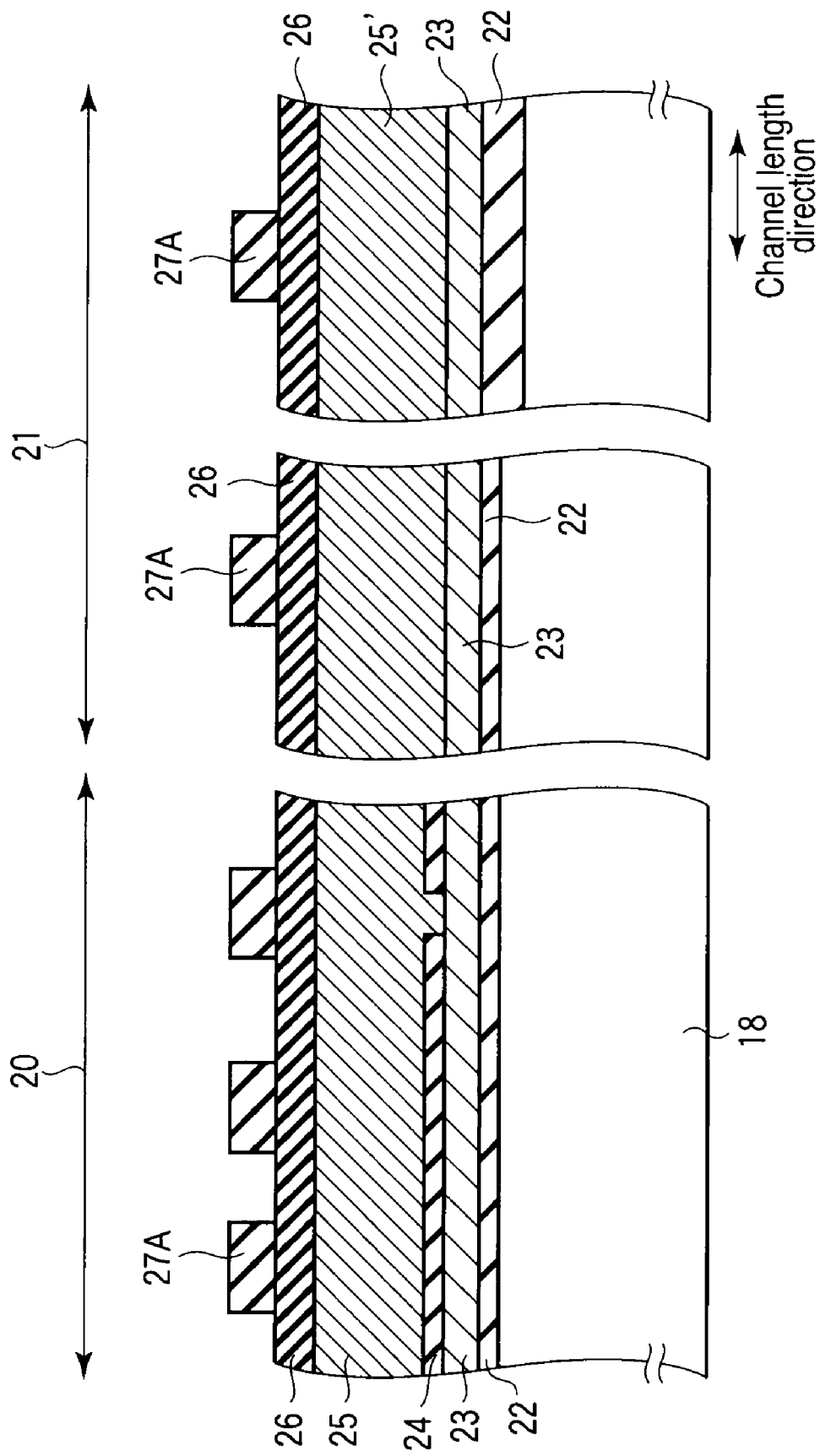
FIGS. 8A, 8B and 8C are sectional views taken along the channel length direction, showing the formation process of the present invention.
Figure 9:
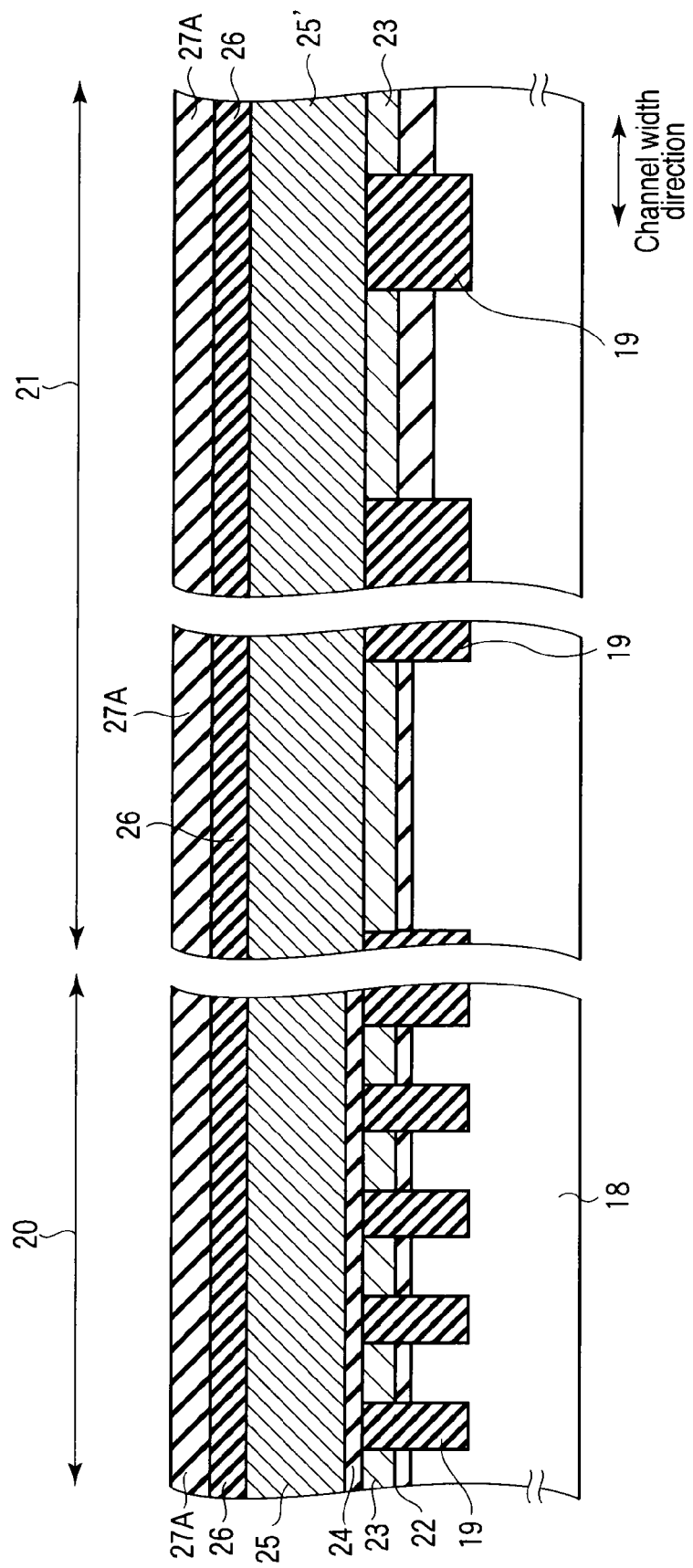
FIGS. 9A, 9B and 9C are sectional views taken along the channel width direction, showing the formation process of the present invention.

As shown in FIGS. 8 and 9, in the memory cell array area 20 and the peripheral circuit area 21, a first mask material 26 is formed on the word line material 25 and a gate electrode material 25' using the CVD process, for example. Further, a sidewall core material 27A is formed on the first mask material 26 using the CVD process.

The sidewall core material 27A is patterned according to a transfer pattern, and thereafter, processed using reactive ion etching (RIE) so that a predetermined pattern is obtained.

Figure 10:
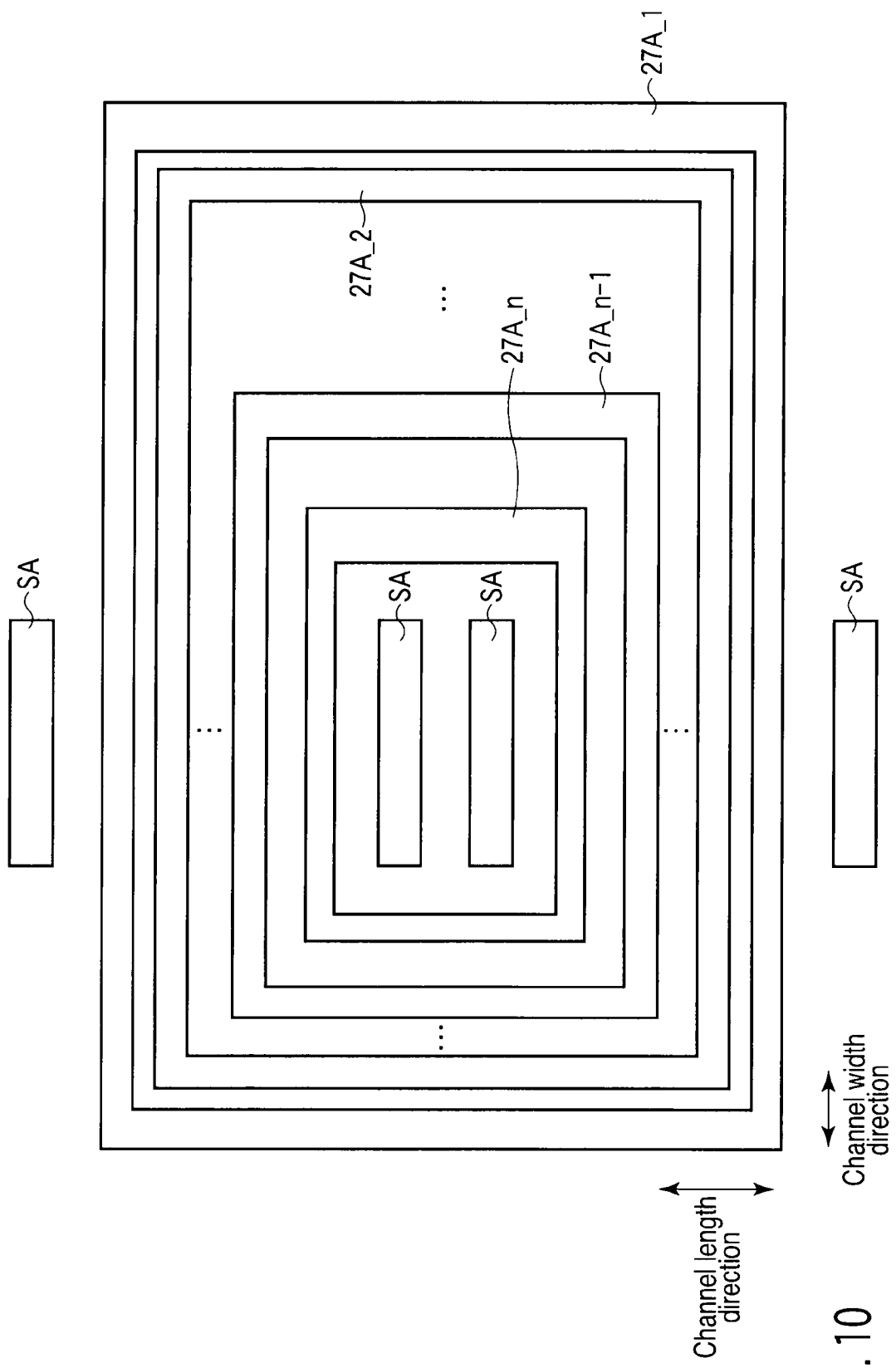
FIG. 10 is a plan view showing a memory cell array area, showing the formation process of the present invention.

Specifically, as seen from a plan view of FIG. 10, the sidewall core material 27A on the memory cell array area has a closed loop shape. Namely, the sidewall core material 27 comprises the following sidewall core materials. One is the outermost sidewall core material 27A_1, and another is sidewall core materials 27A_2 . . . 27A_n−1 arranged inside the core material 27A. Another is a sidewall core material 27A_n arranged inside these core materials 27A_2 . . . 27A_n−1. Further, the sidewall core material 27A is processed so that a line and space pattern is formed in an area relative to a select gate transistor formation region SA. The sidewall core material 27A_n is formed to surround the select gate transistor formation region SA.

In the peripheral circuit area 21, the sidewall core material 27A is formed at a portion formed with a gate electrode. As shown in FIG. 11, the sidewall core material 27A is further processed using a slimming technique. In this way, the sidewall core material 27A is processed so that the width becomes smaller than the photolithography resolution limit.

A sidewall mask material 27B is formed on the entire surface. Thereafter, the sidewall mask material 27B is etched back using anisotropic RIE so that the side of the sidewall core material 27A is formed with the sidewall mask material 27B. In this way, a sidewall mask 27 to process fine line and space pattern is formed.

As illustrated in FIG. 12, a resist is coated on the select gate transistor formation region of the memory cell array area 20 and on the sidewall core material 27A and the sidewall mask material 27B of the peripheral circuit area 21. The sidewall core material 27A of the memory cell transistor formation region on the memory cell array area 20 is selectively removed. Thereafter, the resist on the select gate transistor formation region and the peripheral circuit area 21 is removed.

Thereafter, the first mask material 26 is etched by RIE (a first-time etching) using the following materials as a mask. One is the sidewall mask material 27B in the memory cell transistor formation region of the memory cell array area 20. Another is the sidewall core material 27A and the sidewall mask material 27B as a mask in an area forming a select transistor of the memory cell array area 20 and the peripheral circuit area.

Figures 13A, 13B, 13C:
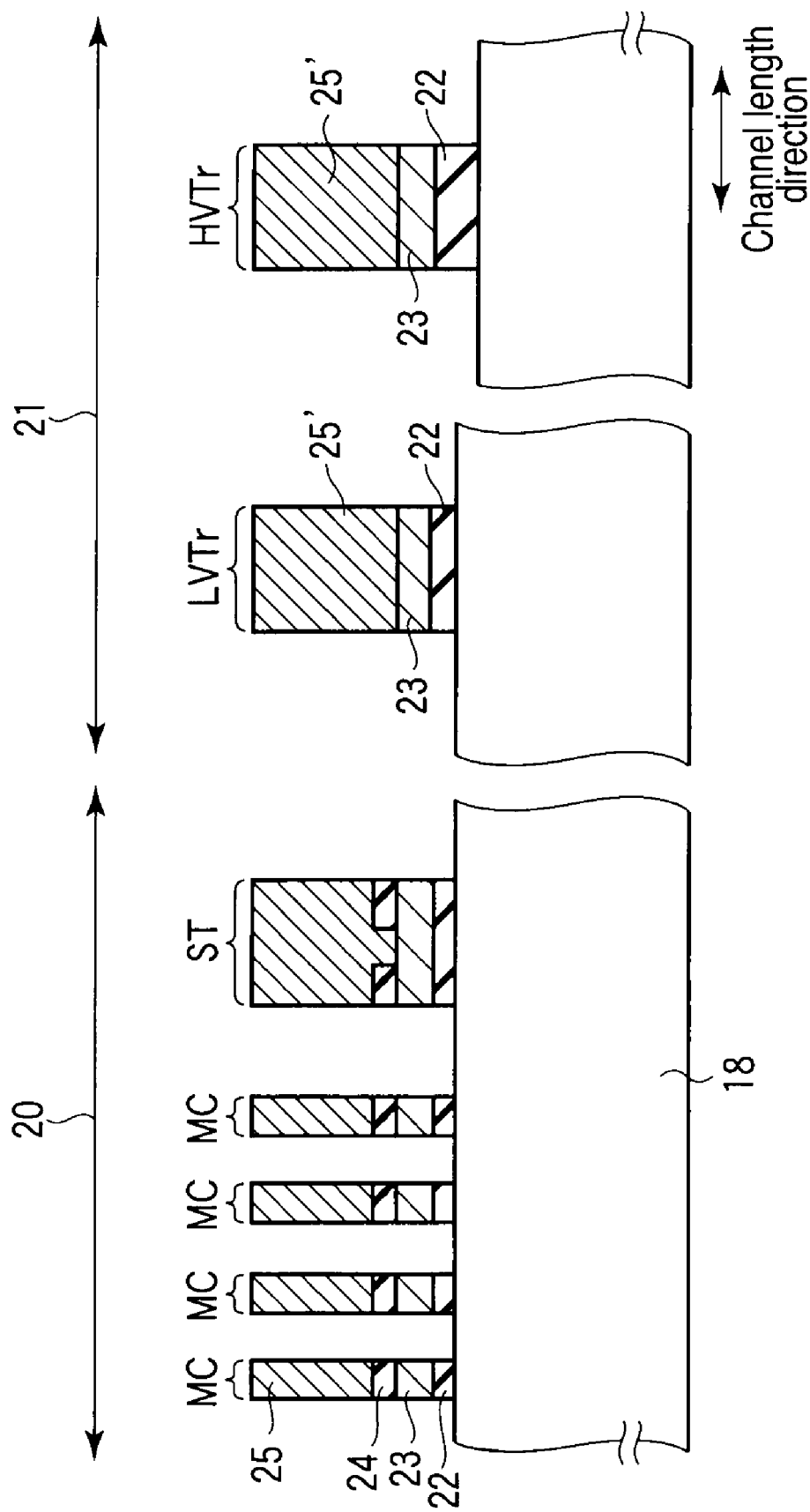
FIGS. 13A, 13B and 13C are sectional views taken along the channel length direction, showing the formation process of the present invention.

As depicted in FIGS. 13 and 14, the sidewall core material 27A and the sidewall mask material 27B are removed. In the memory cell array area 20, the word line 25, intergate insulating film 24, floating gate electrode material 23 and gate insulating film material 22 are successively etched using the first mask material 26. In this way, each layer is divided to a memory cell transistor MC formation region and a select gate transistor ST formation region. The first mask material 26 is removed.

Simultaneously, in the peripheral circuit area, the sidewall core material 27A and the sidewall mask material 27B are removed. The gate electrode material 25', intergate insulating film material 24, floating gate electrode material 23 and gate insulating film material 22 are successively etched. In this way, each layer is divided to a region, which is formed with each electrode of a low-breakdown-voltage field-effect transistor LVTr and a high-breakdown-voltage field-effect transistor HVTr. The first mask material 26 is removed.

Figure 15:
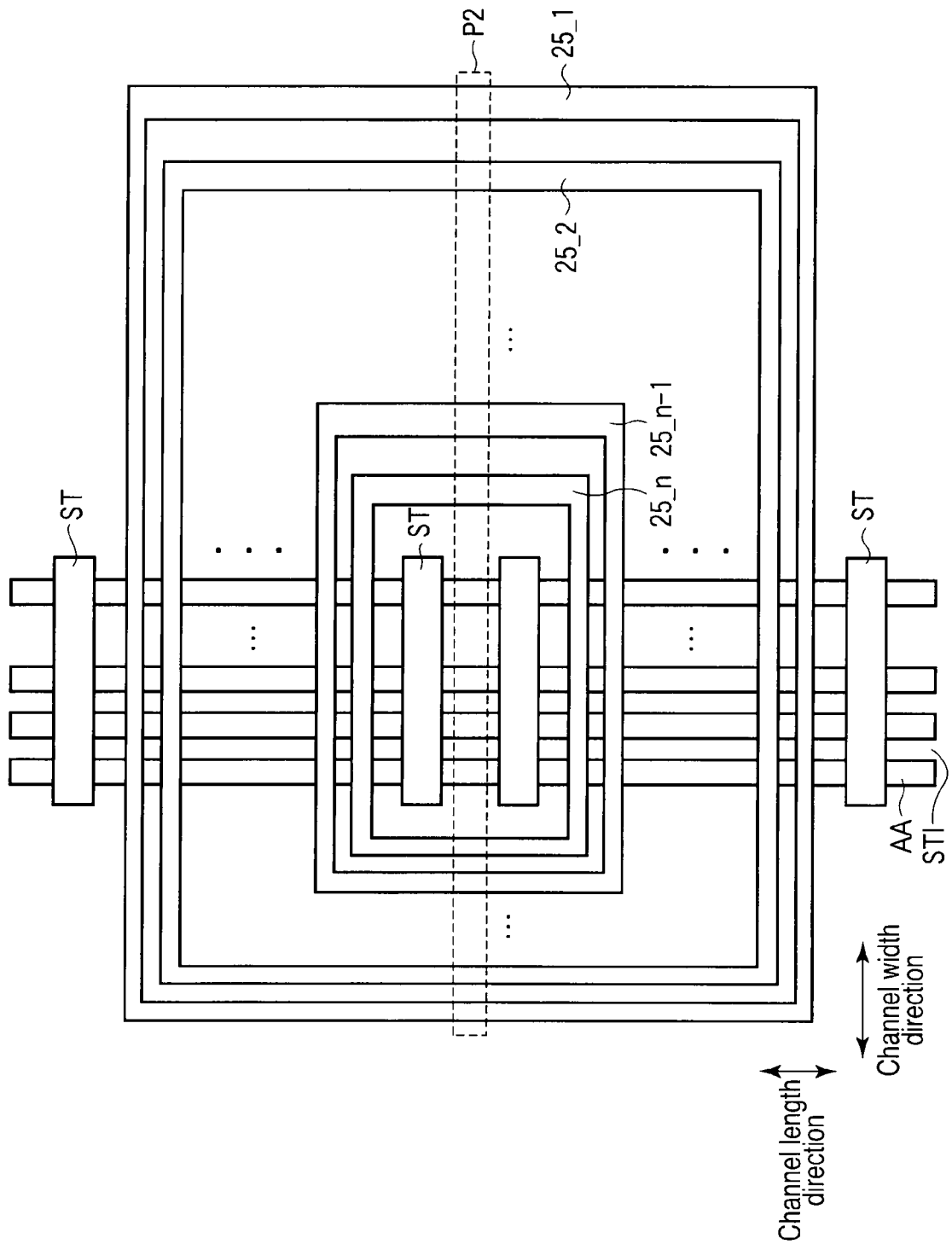
FIG. 15 is a plan view showing another memory cell array area, showing the formation process of the present invention.

As shown in a plan view of FIG. 15, the word line 25 formed under a sidewall mask material remains in the memory cell array area 20. For this reason, the gate electrode material 25 is processed to a fine line and space pattern compared with the photolithography resolution limit in an area relative to the select gate transistor formation region ST.

Figure 16A:
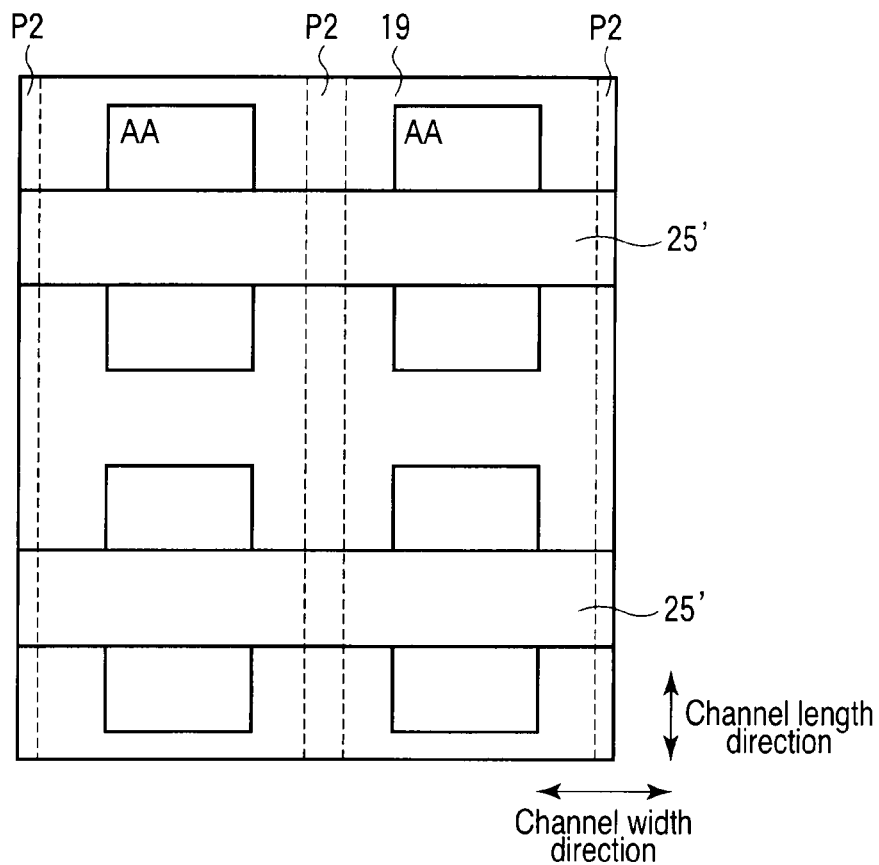
FIGS. 16A and 16B are plan views showing a peripheral circuit area, showing the formation process of the present invention.

As shown in a plan view of FIG. 16A, the gate electrode material 25' of a high-breakdown-voltage field-effect transistor in the peripheral circuit area is formed in ranging element regions AA and extending in the channel width direction by the first-time etching in the peripheral circuit area formed with the high-breakdown-voltage field-effect transistor. Namely, gate electrodes of neighboring transistors in the channel width direction are formed in being electrically connected to each other.

Figure 16B:
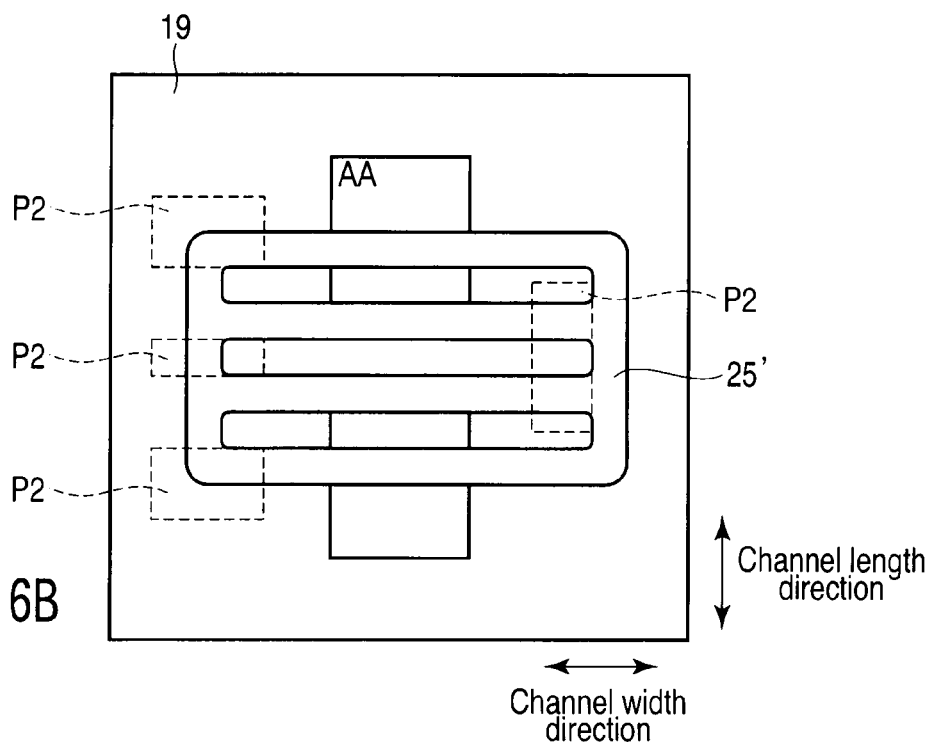

Moreover, as shown in a plan view of FIG. 16B, the gate electrode material 25' of the low-breakdown-voltage field-effect transistor of the peripheral circuit area is formed with three openings, which extend in the channel width direction, by the first-time etching. Namely, the gate electrode materials 25' of low-breakdown-voltage field-effect transistors are used in common at the end portion thereof in the channel width direction, and formed in a state of being electrically connected to each other.

Figure 17:
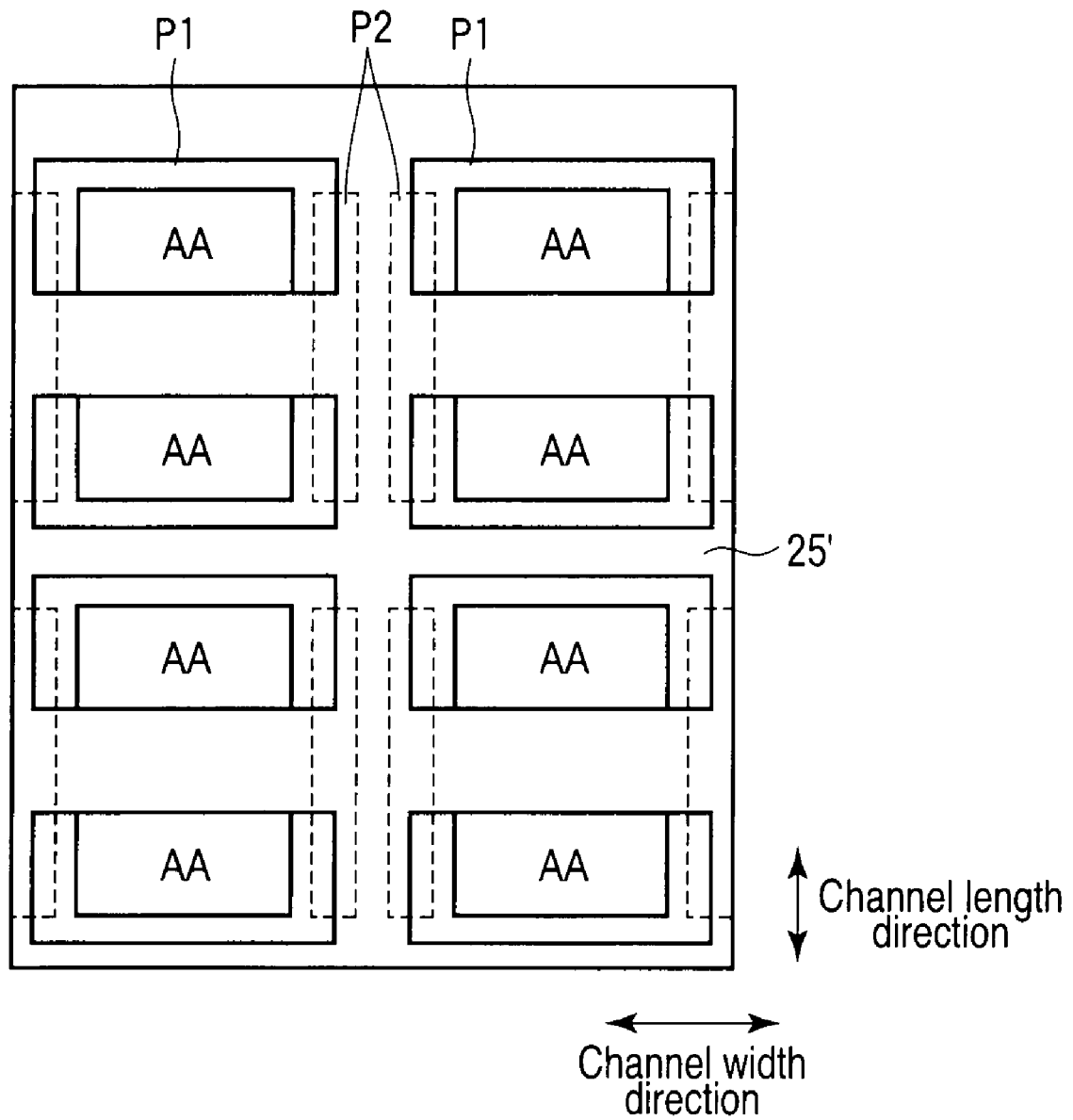
FIG. 17 is a plan view showing a peripheral circuit area, showing the formation process according to a modification example of the present invention.

In case of the shield conductive layer 17 shown in FIG. 5 is formed, as shown in FIG. 17, the gate electrode material 25' of the high-breakdown-voltage field-effect transistor may be formed with an opening P1 so that a contact 12 of the element region AA is opened.

Figures 18A, 18B, 18C:
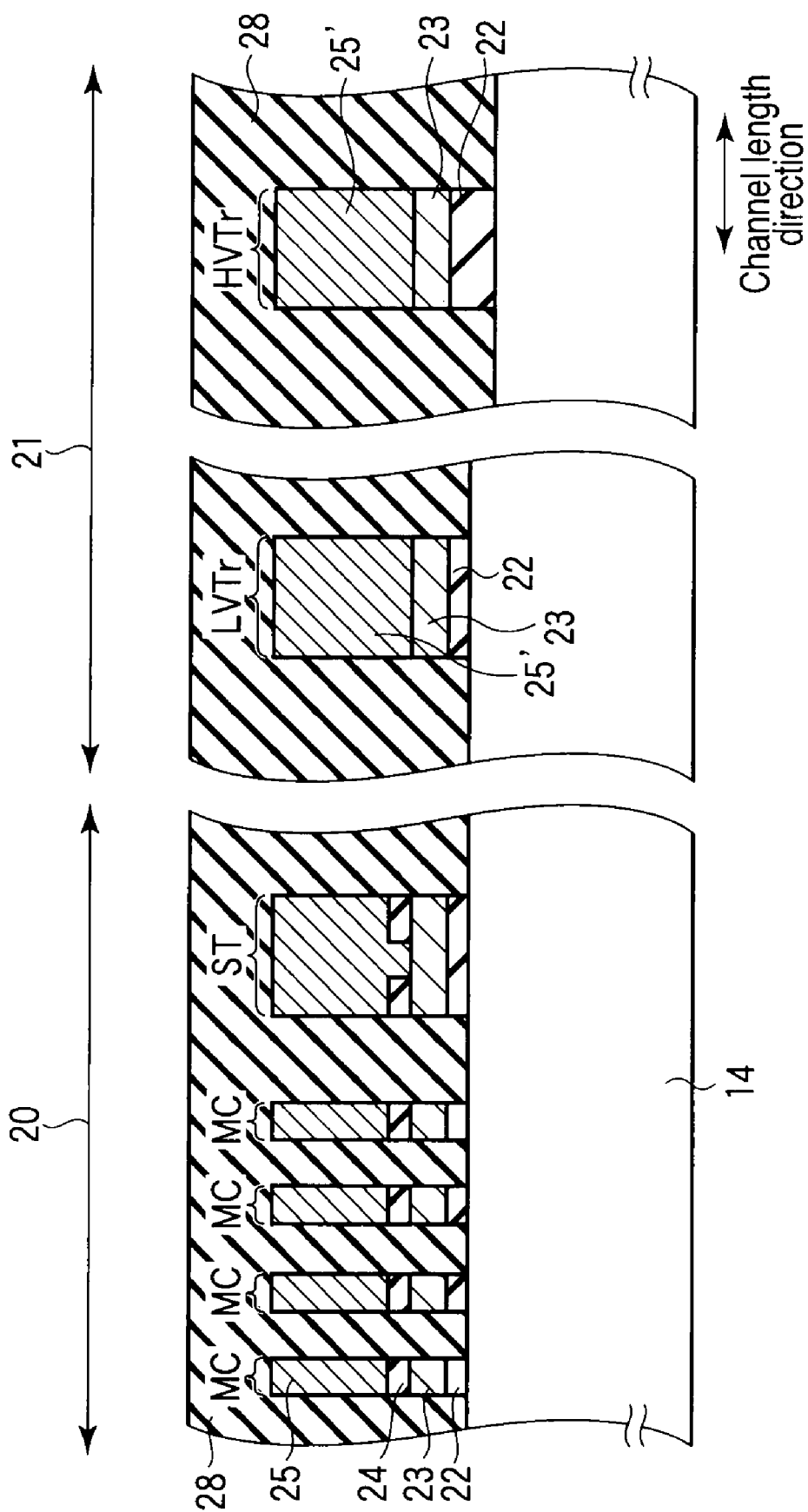
FIGS. 18A, 18B and 18C are sectional views taken along the channel length direction, showing the formation process of the present invention.
Figures 19A, 19B, 19C:
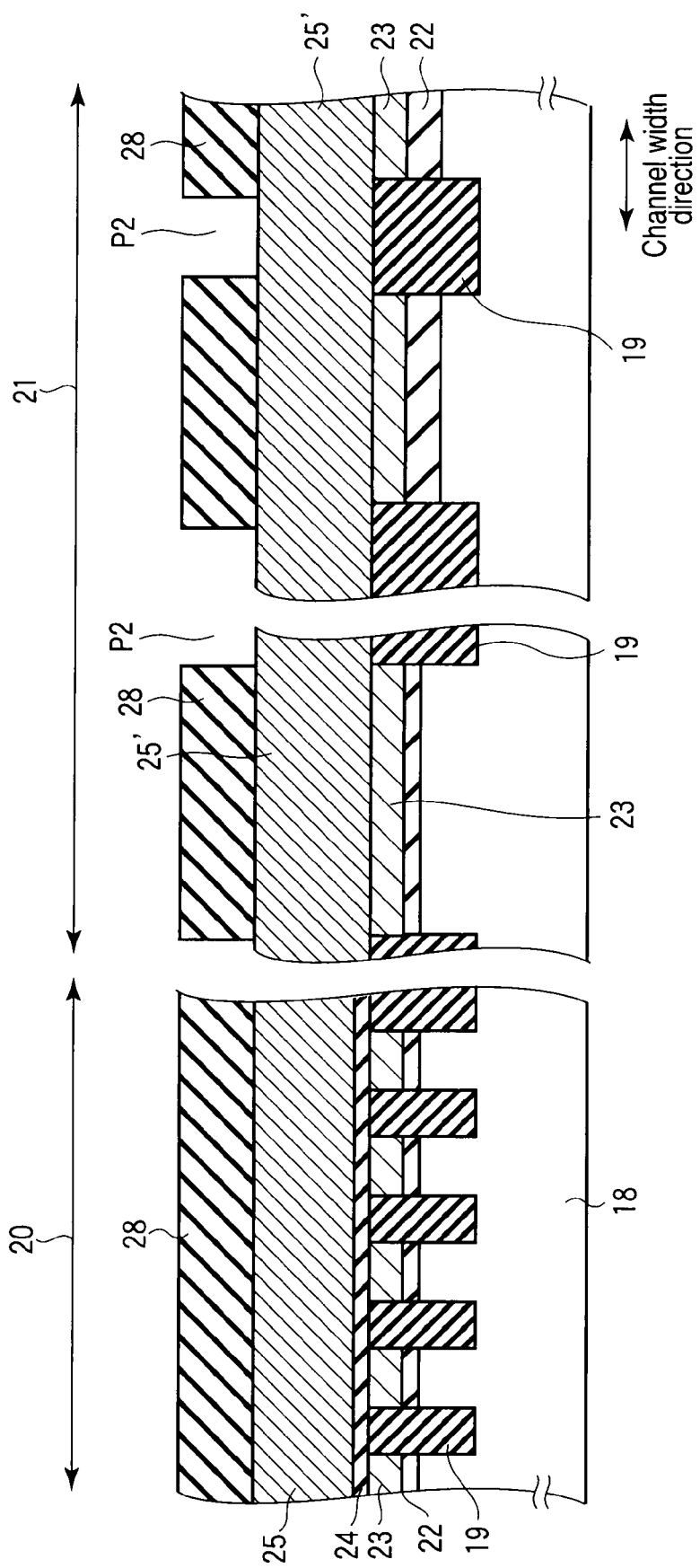
FIGS. 19A, 19B and 19C are sectional views taken along the channel width direction, showing the formation process of the present invention.

As illustrated in FIGS. 18 and 19, a second mask material 28 is formed on the entire surface in the memory cell array area 20 and the peripheral circuit area 21. The loop-like structure of word line 25 is formed to a line-like structure using the second mask material in the memory cell array area 20; a so-called sidewall loop cut process. Specifically, as seen from FIG. 15, a second mask material 28 having a straight opening P2 extending in the channel width direction is formed between select gate transistor formation regions ST. Simultaneously, as shown in FIG. 16A, a second mask material 28 having a straight opening P2 extending in the channel length direction is formed between the element regions AA, in the peripheral circuit area 21 formed with a high-breakdown-voltage field-effect transistor. Simultaneously, as shown in FIG. 16B, a second mask material 28 having an opening P2 is formed so that the pattern of the gate electrode material 25' of each low-breakdown-voltage field-effect transistor is formed, in the peripheral circuit area 21 formed with the low-breakdown-voltage field-effect transistor.

Moreover, in case of the shield conductive layer 17 shown in FIG. 5 is formed, as shown in FIG. 17, an opening P2 may be formed so that the gate electrode material 25' of a high-breakdown-voltage field-effect transistor is cut from the shield conductive layer 17. Specifically, a second mask material 28 having a straight opening P2 is formed; in this case, the opening P2 includes a portion connecting the gate electrode material 25' of the high-breakdown-voltage field-effect transistor and the shield conductive layer 17. In addition, preferably, the opening P2 is formed to include a part of the shield conductive layer 17 in order to improve a lithography margin.

Figure 21:
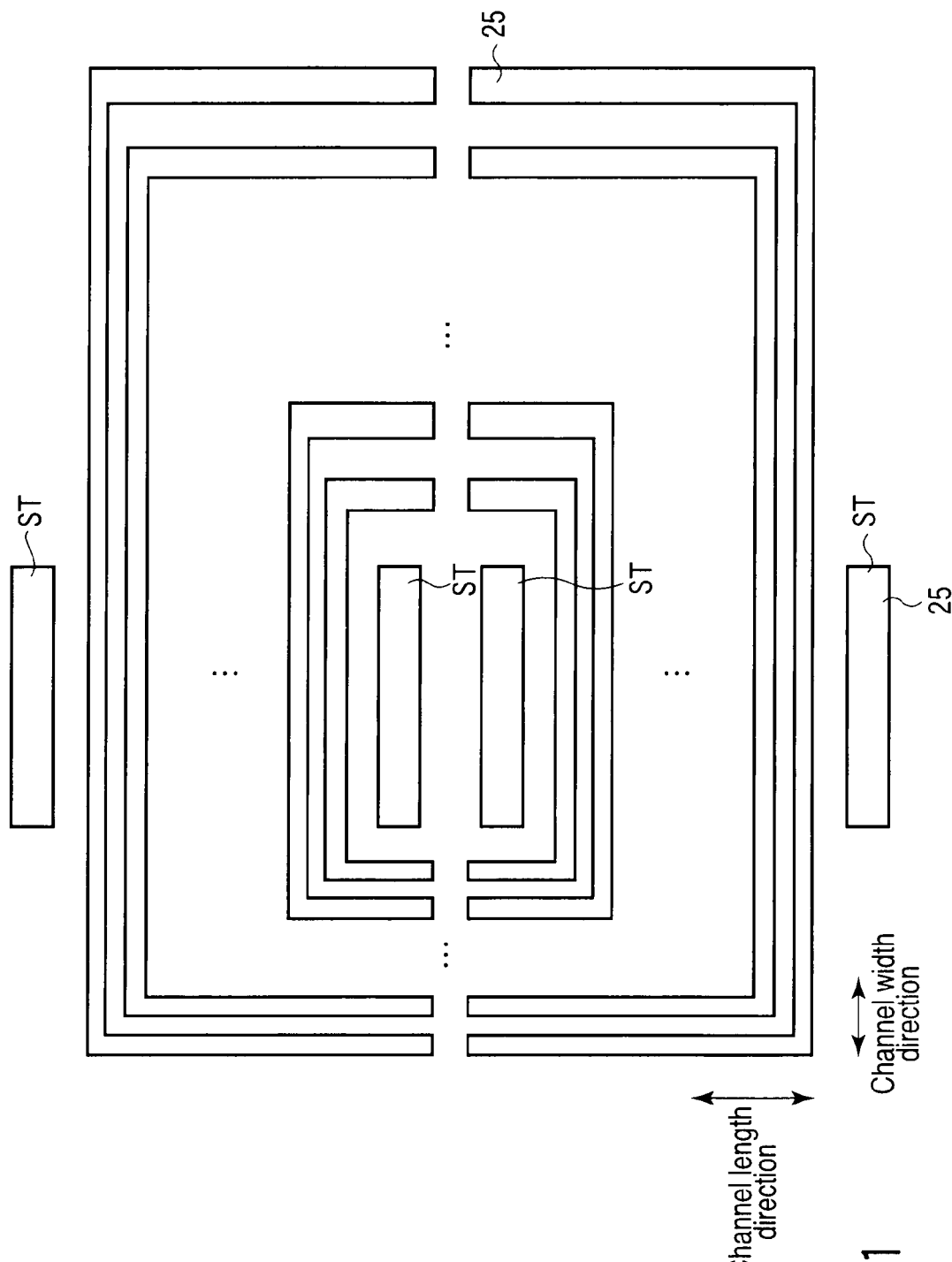
FIG. 21 is a plan view showing another memory cell array area, showing the formation process of the present invention.

As shown in FIG. 20, the word line 25 and the gate electrode material 25' of the opening of a second mask material are divided using the second mask material 28 by RIE (a second-time etching), for example. As a result, as a plan view of FIG. 21, each word line 25 is bent toward the channel length direction at the end portion in the channel width direction. The bent portion of the word line material 25 in the channel length direction is cut at a position extending in the channel width direction from the select gate transistor ST. Moreover, the gate electrode material 25' is processed to a fine line and space pattern compared with the lithography resolution limit.

An isolation insulating film 19 exposed by the opening P2 under the cut word line material 25 and gate electrode material 25' is formed with a recess by a sidewall loop cut process.

Figure 22A:
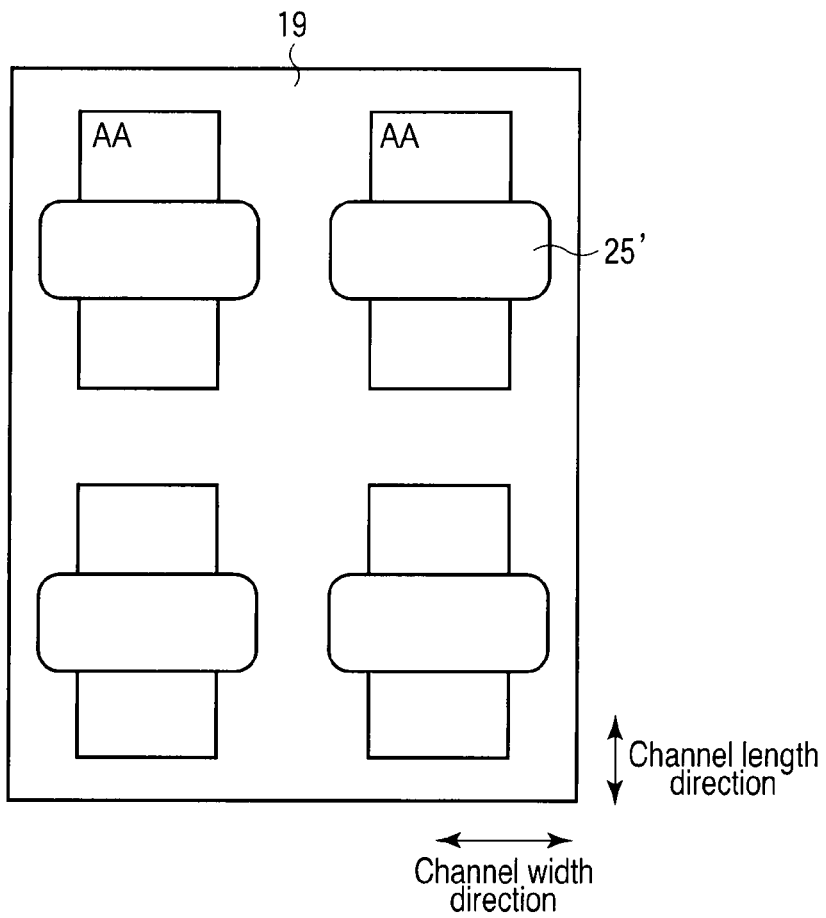
FIGS. 22A and 22B are plan views showing another peripheral circuit area, showing the formation process of the present invention.

As depicted in a plan view of FIG. 22A, the gate electrode material 25' of a high-breakdown-voltage field-effect transistor of the peripheral circuit area is divided to a plurality of parts. In this case, the gate electrode material 25' is formed to correspond to a high-breakdown-voltage field-effect transistor formed on each element region AA using the second-time etching, that is, a sidewall loop cut process (simultaneously with sidewall loop cut process).

Figure 22B:
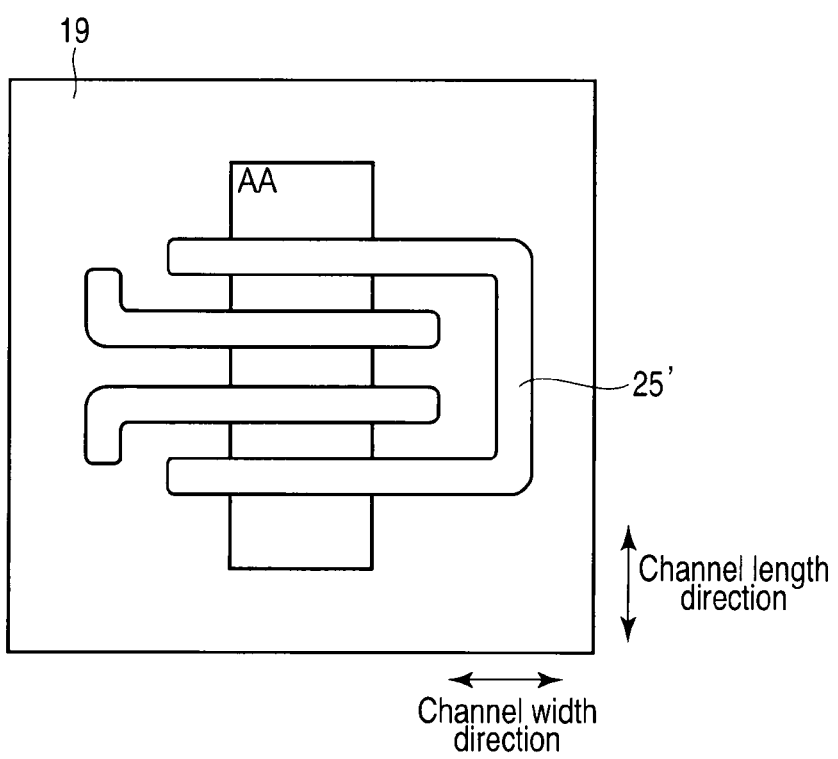

As shown in a plan view of FIG. 22B, the gate electrode material 25' of a high-breakdown-voltage field-effect transistor in the peripheral circuit area is formed in the following manner. Namely, the gate electrode material 25' is divided so that the element region AA is formed with four low-breakdown-voltage field-effect transistors using the second-time etching, that is, a sidewall loop cut process (simultaneously with sidewall loop cut process).

As described above, the second-time etching is carried out with respect to each gate electrode of low- and high-breakdown-voltage field-effect transistors formed on the peripheral circuit area by means of a sidewall loop cut process (simultaneously with sidewall loop cut process). Thus, extra process dose not have to be added.

A pitch of the channel width direction of a low-breakdown-voltage field-effect transistor formed in a sense amplifier is very narrow. For this reason, the width of the channel width direction of an isolation insulating film is very narrow. If the upper surface of the isolation insulating film is formed with a recess having the same size as the lithography resolution, there is the case where element isolation becomes insufficient. Considering the circumstances, a width of the recess in the upper surface of the element isolation insulating film is formed narrower using reactive ion etching (RIE).

Figure 23:
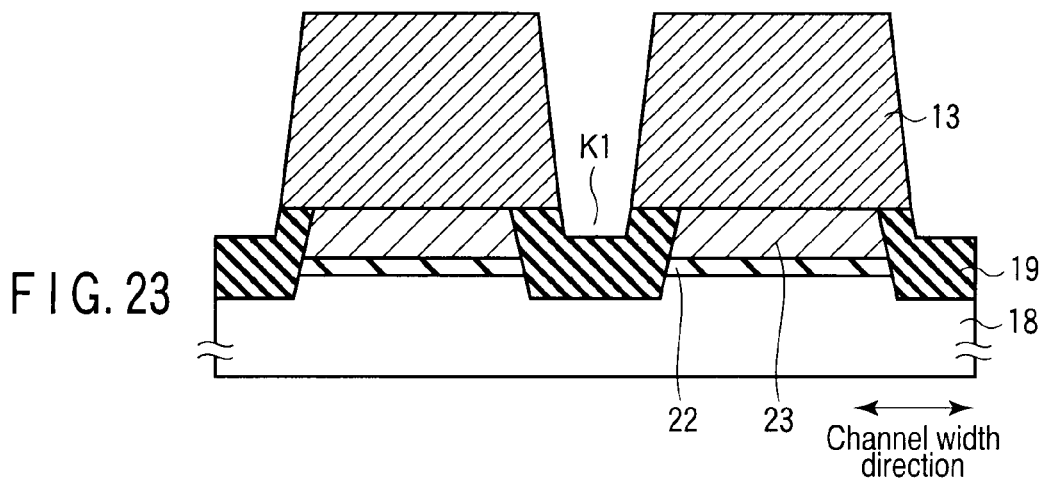
FIG. 23 is a sectional view taken along the channel width direction showing a low-breakdown-voltage field-effect transistor formed in a sense amplifier.

So, the reactive ion etching (RIE) condition is changed, and thereby, as seen from FIG. 23, an opening formed by diving the gate electrode is formed into a forward-taper shape (i.e., taper shape such that the width becomes small from the upper portion of the opening to the bottom portion thereof). In other words, the gate electrode is formed to have a taper shape having a width widened from the upper portion toward the bottom portion in the channel width direction. As a result, the upper surface of the element isolation insulating film is formed with a recess K1 having smaller. In this way, it is possible to shrink of the peripheral circuit area. The recess has a taper shape having a width of the channel width direction, which becomes wide from the lower portion toward the upper portion in a film thickness direction.

Each opening P2 formed in memory cell array area 20 and peripheral circuit area 21 has a straight shape in a plan view. As a result, it is possible to improve a lithography margin.

There is the case where a field-reverse leakage current is generated in a transfer transistor formed in a word line driver.

Figure 24:
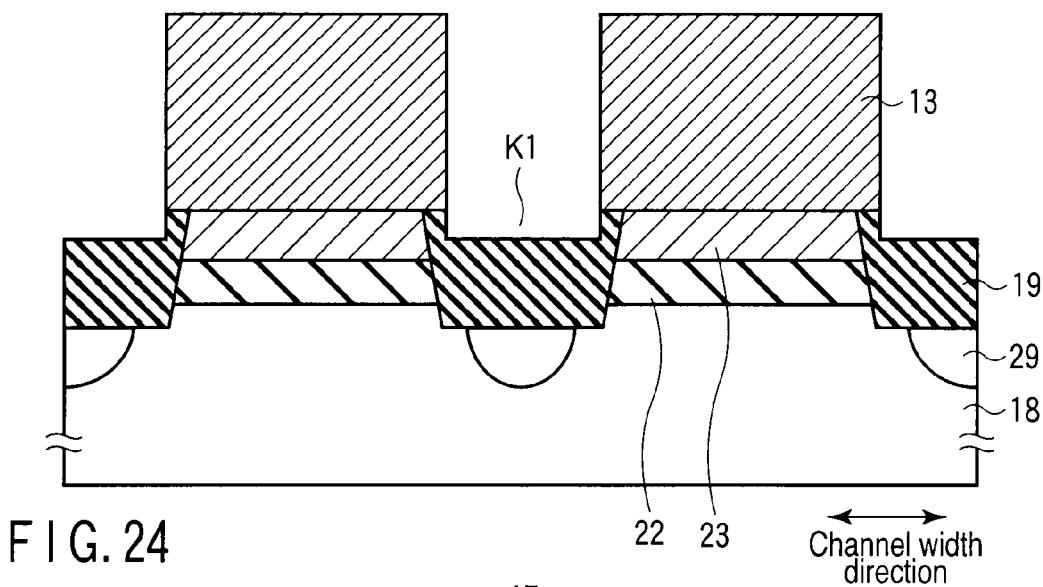
FIG. 24 is a sectional view taken along the channel width direction showing a transfer transistor formed in a word line driver.

Considering the circumstances, as shown in FIG. 24, field through implantation may be injected through the opening P2 after two-time etchings are carried out with respect to a gate electrode in a transfer transistor formed in a word line driver. According to the field through implantation, for example, boron ions are implanted into a semiconductor substrate 18 under the isolation insulating film 19. In this way, the semiconductor substrate 18 is formed with an impurity layer 29. The impurity layer 29 is formed, and thereby, it is possible to prevent a field-reverse leakage current.

A method of forming a shield conductive layer on the element isolation insulating film 19 is given as the method of preventing the field-revere leakage current without adding the field through implantation.

Figure 25:
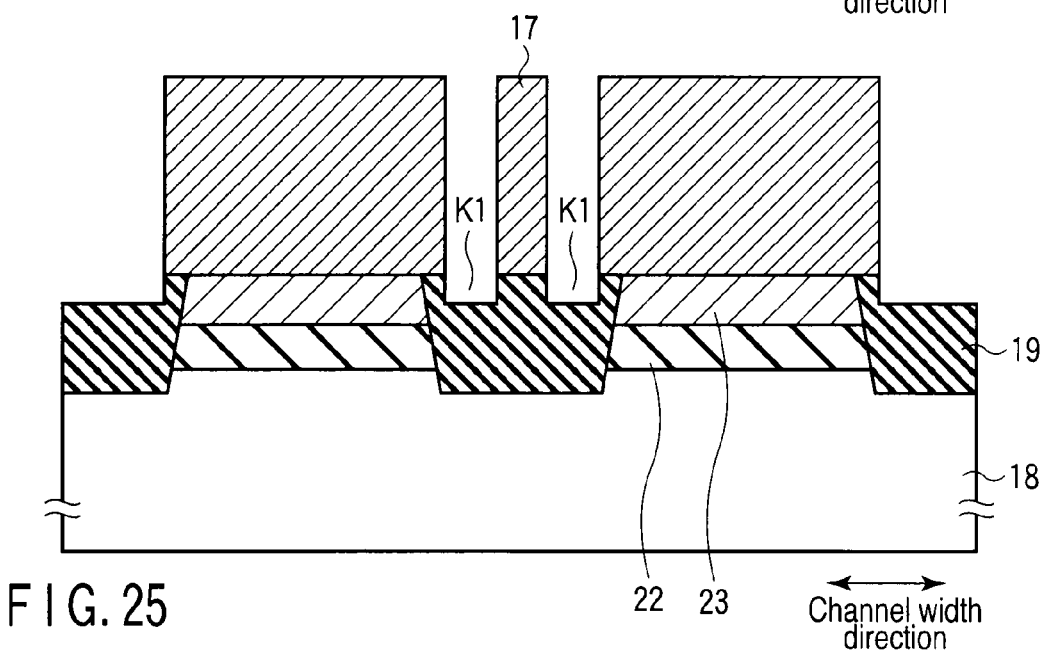
FIG. 25 is a sectional view taken along the channel width direction showing another transfer transistor formed in a word line driver.

As illustrated in FIG. 25, patterning may be changed so that a gate electrode material 25 remains on the isolation insulating film 19 in a transfer transistor formed in a word line driver. In this way, a shield conductive layer 17 is formed on the isolation insulating film 19. In other words, the shield conductive layer 17 is a part of a gate electrode material. Therefore, the shield conductive layer 17 is grounded, and then, zero voltage or a predetermined negative bias is applied to the layer 17. In this way, a field-reverse leakage current may be prevented.

Thereafter, in the memory cell array area, a normal process is carried out to process the following various materials. Namely, the word line material is processed to a word line, and the intergate insulating material is processed to an intergate insulating film. Further, the floating gate electrode material is processed to a floating gate electrode, and the gate insulating film material is processed to a gate insulating film. In this way, low- and high-breakdown-voltage field-effect transistors are formed.

Likewise, in the peripheral circuit area, a normal process is carried out to process the following various materials. Namely, the gate electrode material is processed to a gate electrode, and the intergate insulating material is processed to an intergate insulating film. Further, the floating gate electrode material is processed to a floating gate electrode, and the gate insulating film material is processed to a gate insulating film. In this way, low- and high-breakdown-voltage field-effect transistors are formed.

Moreover, if a so-called sidewall processing is used, there is a tendency for the radius of curvature r at the end portion of the gate electrode shown in FIG. 2 to become larger because of slimming technique. For example, the end portion of a gate electrode, which is not processed using a sidewall cut process (simultaneously with sidewall cut process) has 90 nm or more. Namely, the radius of curvature of the end portion of the gate electrode processed by the sidewall loop cut process (the gate electrode processed by using the first-time etching and the second-time etching) is smaller than that of the end portion of the gate electrode, which is not processed by the sidewall loop cut process (the gate electrode processed by using only first-time etching). In other words, the sidewall loop cut process (the gate electrode processed by using the first-time etching and the second-time etching) is carried out, and thereby, the gate electrode 13 is cut off. This serves to make small the radius of curvature r, and thus, to achieve scale reduction of the peripheral circuit area.

In particular, the radius of curvature r of gate electrode 13_1 of low-breakdown-voltage field-effect transistor 11b_1 facing gate electrode 13_2 shown in FIG. 3 is made small. As a result, the gate fringe length L of transistor 11b_1 is made small; therefore, this serves to achieve scale reduction of the peripheral circuit area.

In addition, if the present invention is applied, for example, the point A, which is not processed by the sidewall loop cut of FIG. 4 differs from the point B, which is processed by the sidewall loop cut in the radius of curvature. In other words, the radius of curvature of the point B is smaller than that of the point A.

And, if the present invention is applied, for example, the point C, which is not processed by the sidewall loop cut of FIG. 3A differs from the point B, which is processed by the sidewall loop cut in the radius of curvature. In other words, the radius of curvature of the point B is smaller than that of the point C.

3. Application Example

The embodiment of the present invention is not limited to a stuck-structure memory cell transistor having a floating gate electrode. For example, the present invention is applicable to a MONOS-structure memory cell transistor.

4. Conclusion

According to the present invention, the shape of the corner of a gate electrode of a field-effect transistor of a peripheral circuit area is improved so that the area of the peripheral circuit area is reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising: a memory cell array area; and
   a peripheral circuit area formed around the memory cell array area,
   wherein the peripheral circuit area has element regions, an element isolation region isolating the element regions, and field-effect transistors formed in the element regions respectively, each of the field-effect transistors including a gate electrode extending in a channel width direction, and
   an end portion and a corner portion of the gate electrode in the channel width direction projects from the element region, and are disposed on the element isolation region, and further,
   the element isolation region has a recess extends in a channel length direction orthogonal to the channel width direction and between the gate electrodes of the field-effect transistors, the gate electrodes are adjacent to each other in the channel width direction, and wherein the recess not located between the gate electrodes is deeper than the recess located between the gate electrodes.

2. The device according to claim 1, wherein the gate electrode has a taper shape having a width of the channel width direction, which becomes wide from the upper portion toward the lower portion in a film thickness direction, and
   the recess has a taper shape having a width of the channel width direction, which becomes wide from the lower portion toward the upper portion in a film thickness direction.

3. The device according to claim 1, wherein the end portion of the gate electrode coincides with an end potion of the recess.

4. The device according to claim 1, wherein the memory cell array area includes word lines having two bent points, and memory element regions located between the two bent points of the word lines.

5. The device according to claim 1, wherein the memory cell array area includes word lines made by a side wall processing technique.

* * * * *